(12) United States Patent
Do

(10) Patent No.: US 12,068,325 B2
(45) Date of Patent: Aug. 20, 2024

(54) OPTIMIZATION OF SEMICONDUCTOR CELL OF VERTICAL FIELD EFFECT TRANSISTOR (VFET)

(71) Applicant: SAMSUNG ELECTRONICS CO., LTD., Suwon-si (KR)

(72) Inventor: Jung Ho Do, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/155,386

(22) Filed: Jan. 17, 2023

(65) Prior Publication Data

US 2023/0178558 A1 Jun. 8, 2023

Related U.S. Application Data

(63) Continuation of application No. 16/941,042, filed on Jul. 28, 2020, now Pat. No. 11,581,338.

(60) Provisional application No. 62/910,635, filed on Oct. 4, 2019.

(51) Int. Cl.
*H01L 27/118* (2006.01)

(52) U.S. Cl.
CPC .......... *H01L 27/11807* (2013.01); *H01L 2027/11831* (2013.01); *H01L 2027/11851* (2013.01); *H01L 2027/11875* (2013.01); *H01L 2027/11881* (2013.01)

(58) Field of Classification Search
CPC ..... H01L 27/11807; H01L 2027/11831; H01L 2027/11851; H01L 2027/11875; H01L 2027/11881
USPC ........................................................ 257/206
See application file for complete search history.

(56) References Cited

U.S. PATENT DOCUMENTS

| | | |
|---|---|---|
| 7,028,285 B2 | 4/2006 | Cote et al. |
| 7,138,685 B2 | 11/2006 | Hsu et al. |
| 7,391,250 B1 | 6/2008 | Chuang |
| 8,595,661 B2 | 11/2013 | Kawa et al. |
| 8,829,963 B1 | 9/2014 | Bartling et al. |
| 9,318,169 B2 | 4/2016 | Won et al. |

(Continued)

FOREIGN PATENT DOCUMENTS

CN 108494386 * 9/2018

*Primary Examiner* — Sheng-Bai Zhu
(74) *Attorney, Agent, or Firm* — Sughrue Mion, PLLC

(57) ABSTRACT

A vertical field effect transistor (VFET) cell implementing a VFET circuit over a plurality of gate grids includes: a $1^{st}$ circuit including at least one VFET and provided over at least one gate grid; and a $2^{nd}$ circuit including at least one VFET and provided over at least one gate grid formed on a left or right side of the $1^{st}$ circuit, wherein a gate of the VFET of the $1^{st}$ circuit is configured to share a gate signal or a source/drain signal of the VFET of the $2^{nd}$ circuit, and the $1^{st}$ circuit is an (X−1)-contacted poly pitch (CPP) circuit, which is (X−1) CPP wide, converted from an X-CPP circuit which is X CPP wide and performs a same logic function as the (X−1)-CPP circuit, X being an integer greater than 1.

9 Claims, 25 Drawing Sheets

(56) References Cited

U.S. PATENT DOCUMENTS

| | | |
|---|---|---|
| 9,761,712 B1 | 9/2017 | Anderson et al. |
| 9,859,898 B1 | 1/2018 | Anderson et al. |
| 10,096,709 B2 | 10/2018 | Le et al. |
| 10,361,128 B2 | 7/2019 | Anderson et al. |
| 2002/0087930 A1 | 7/2002 | Kanba |
| 2005/0104133 A1 | 5/2005 | Kanno et al. |
| 2009/0300448 A1 | 12/2009 | Tomita et al. |
| 2013/0173977 A1* | 7/2013 | Gurumurthy .. G01R 31/318552 714/E11.155 |
| 2015/0070063 A1* | 3/2015 | Gurumurthy ......... H03K 3/012 327/203 |
| 2015/0358004 A1* | 12/2015 | Shirai ................ H03K 3/0372 327/218 |
| 2016/0094204 A1* | 3/2016 | Nandi ................ H03K 3/0372 327/203 |
| 2016/0097811 A1* | 4/2016 | Kim ............... G01R 31/318541 714/726 |
| 2017/0358586 A1 | 12/2017 | Huynh Bao et al. |
| 2018/0006025 A1 | 1/2018 | Hook et al. |
| 2018/0026042 A1 | 1/2018 | Smith et al. |
| 2018/0122792 A1 | 5/2018 | Anderson et al. |
| 2018/0145073 A1 | 5/2018 | Bentley et al. |
| 2018/0152175 A1 | 5/2018 | Lai et al. |
| 2018/0175024 A1* | 6/2018 | Do ....................... H01L 23/528 |
| 2018/0183414 A1* | 6/2018 | Guo ...................... H03K 23/58 |
| 2018/0269204 A1 | 9/2018 | Balakrishnan et al. |
| 2020/0020700 A1 | 1/2020 | Lin et al. |
| 2021/0104627 A1 | 4/2021 | Wu et al. |

\* cited by examiner

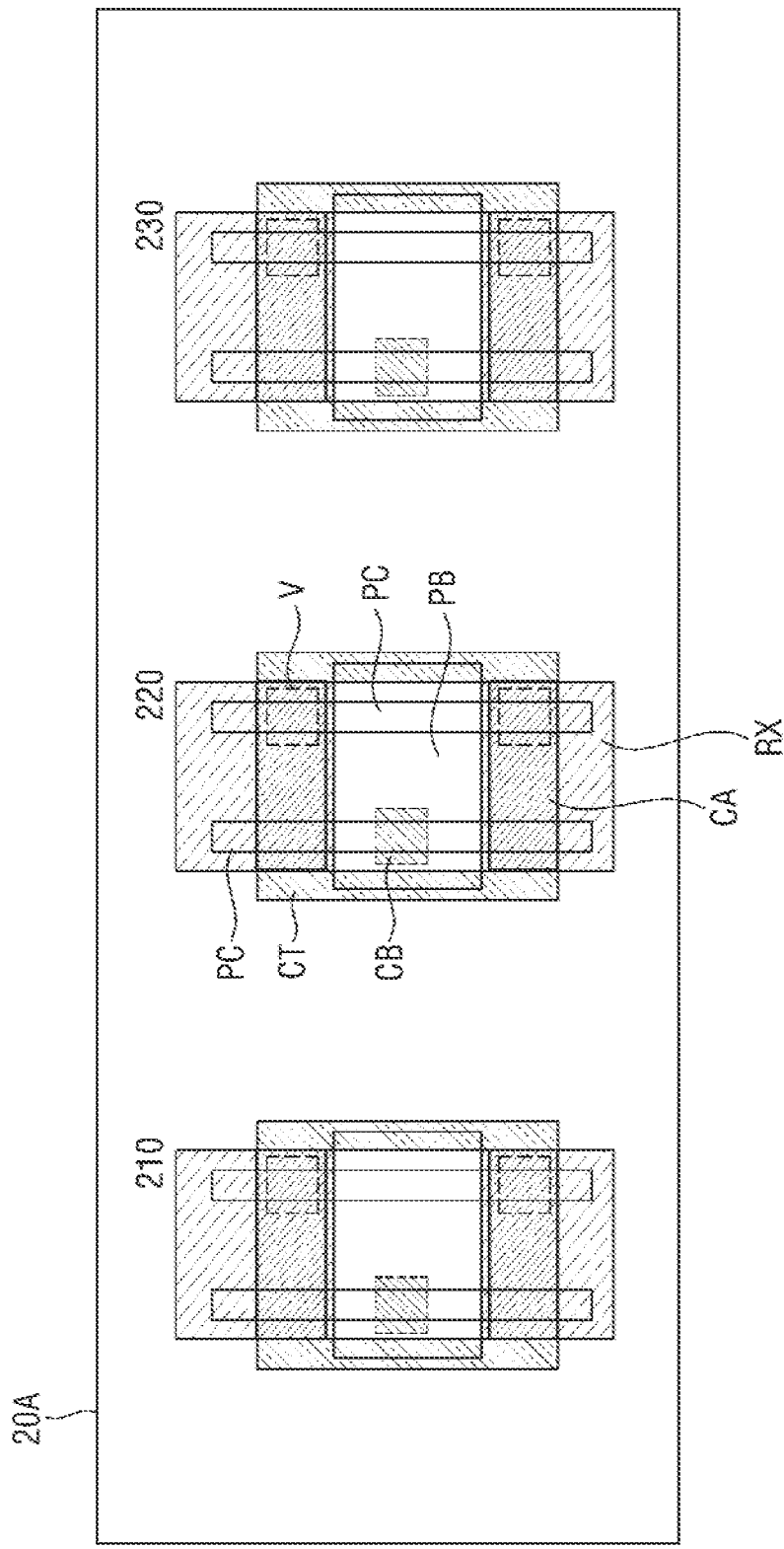

1300

OPTIMIZATION OF SEMICONDUCTOR CELL OF VERTICAL FIELD EFFECT TRANSISTOR (VFET)

CROSS-REFERENCE TO THE RELATED APPLICATION

This is a continuation of U.S. application Ser. No. 16/941,042 filed Jul. 28, 2020, which claims priority from U.S. Provisional Application No. 62/910,635 filed on Oct. 4, 2019 in the U.S. Patent and Trademark Office, the disclosure of which is incorporated herein in its entirety by reference.

BACKGROUND

1. Field

Apparatuses and methods consistent with embodiments of the inventive concept relate to semiconductor cell architectures for circuits formed of vertical field effect transistors (VFETs).

2. Description of the Related Art

Compared to a lateral field effect transistor (FET) such as a planar finFET, a VFET is characterized by its vertical structure in which a top source/drain, a gate, and a bottom source/drain are vertically overlapping.

When designing a semiconductor cell formed of lateral FET circuits based on its layout or top view, it is not uncommon to have adjacent circuits share a source/drain of an FET by reducing the number of dummy gate structures in a cell. However, when designing a semiconductor cell formed of VFET circuits, it is often required to provide an additional gate structure or fin structure, next to a gate structure where VFETs are formed, so that a metal line connecting contact structures of VFETs and/or vias can be placed on the additional gate structure or fin structure to transmit an output signal of the VFETs. A two-fin VFET device such as a two-fin inverter is a typical example. Thus, it is difficult to design a VFET semiconductor cell (hereafter "VFET cell") formed of a one-fin VFET device, such as a one-fin inverter, using only one gate structure or fin structure for the purpose of reducing a cell width or area. This is because of the intrinsic structure of the VFET in which a gate and source/drains vertically overlap.

FIG. 1A illustrates a layout of a VFET cell in which a two-fin inverter is formed over two gate structures according to a related art. FIG. 1B illustrates a schematic of an inverter which can be formed of one p-channel metal-oxide semiconductor VFET (hereafter "PMOS") and one n-channel metal-oxide semiconductor VFET (hereafter "NMOS"). FIG. 1C illustrates a schematic of an inverter which can be formed of two PMOSs and two NMOSs. The inverter shown in FIG. 1C may be implemented in the VFET cell shown in FIG. 1A.

Referring to FIG. 1A, a VFET cell 10 includes a two-fin inverter 100 formed of a pair of one PMOS P and one NMOS N over a gate structure PC and another pair of one PMOS P and one NMOS N over another gate structure PC. Although not shown in FIG. 1A, each of the gate structures PC is cut to a predetermined size to provide for the PMOS P and the NMOS N on two divided portions of a corresponding gate structure PC. The VFET cell 10 also includes two bottom source/drain regions RX respectively connected to a power source (Vdd) and a ground source (Vss) (not shown), a gate connection pattern PB, two gate layer cuts CT from which the gate connection pattern PB is cut out, a gate contact structure CB, two top source/drain contact structures CA, and three vias V.

However, even if the two-fin inverter 100 can be changed to a one-fin inverter implemented by one PMOS and one NMOS on one of the two gate structure PC, the VFET cell 10 may still require another gate structure or fin structure, that is, the other of the two gate structures PC, for connecting the top source/drain contact structures CA to a metal line (not shown for drawing brevity) and the vias V. This is an example of a VFET device structure preventing reduction of a cell width to achieve optimization of a VFET cell architecture.

Thus, there is demand for a VFET cell having a reduced cell width and a method of designing the same that may overcome the above disadvantages of the VFET cell.

SUMMARY

Various embodiments of the inventive concept are directed to semiconductor cell layouts, semiconductor cell architectures, and methods for designing the semiconductor cells including a plurality of VFET circuits formed of a plurality of VFETs.

These embodiments may provide optimized VFET cell architectures which have a reduced cell width, and methods to design the improved VFET cell architectures.

According to embodiments, there is provided a vertical field effect transistor (VFET) cell implementing a VFET circuit over a plurality of gate grids which may include: a $1^{st}$ circuit including at least one VFET and provided over at least one gate grid; and a $2^{nd}$ circuit including at least one VFET and provided over at least one gate grid formed on a left or right side of the $1^{st}$ circuit, wherein a gate of the VFET of the $1^{st}$ circuit is configured to share a gate signal or a source/drain signal of the VFET of the $2^{nd}$ circuit, and the $1^{st}$ circuit is an (X−1)-contacted poly pitch (CPP) circuit, which is (X−1) CPP wide, converted from an X-CPP circuit which is X CPP wide and performs a same logic function as the (X−1)-CPP circuit, X being an integer greater than 1.

According to embodiments, there is provided a vertical field effect transistor (VFET) cell implementing a scan flip-flop with a reset input including a plurality of circuits over $1^{st}$ through $24^{th}$ gate grids, which are consecutively formed and evenly spaced in the VFET cell, wherein the $1^{st}$ gate grid provides a one-fin scan inverter, wherein the $2^{nd}$ through $6^{th}$ gate grids provide a scan stage circuit configured to receive a scan input signal, a data signal, a scan enable signal, and an inverted scan enable signal, wherein the $7^{th}$ through $11^{th}$ gate grids provide a master latch, wherein the $12^{th}$ and $13^{th}$ gate grids provide a two-fin clock inverter, wherein the $14^{th}$ gate grid provides an output circuit comprising a one-fin inverter, wherein the $15^{th}$ through $17^{th}$ gate grids provide a slave data path circuit configured to receive a reset signal for the master latch, wherein the $18^{th}$ and $19^{th}$ gate grids provide a master data path circuit configured to receive the reset signal for the slave latch, and wherein the $20^{th}$ through $24^{th}$ gate grids provide the slave latch.

According to embodiments, there is provided a vertical field effect transistor (VFET) cell implementing a scan flip-flop including a plurality of circuits over $1^{st}$ through $19^{th}$ gate grids, which are consecutively formed and evenly spaced in the VFET cell, wherein the $1^{st}$ gate grid provides a one-fin scan inverter, wherein the $2^{nd}$ through $5^{th}$ gate grids provide a scan stage circuit configured to receive a scan input signal, a data signal, a scan enable signal, and an inverted scan enable signal, wherein the $6^{th}$ through $9^{th}$ gate grids provide a master latch, wherein the 10$^{th}$ and 11$^{th}$ gate grids provide a two-fin clock inverter, wherein the 12$^{th}$ gate grid provides a master data path circuit comprising a one-fin inverter, wherein the 13$^{th}$ through 16$^{th}$ gate grids provide a slave latch, wherein the 17$^{th}$ and 18$^{th}$ gate grids provide a slave data path circuit comprising a two-fin inverter, and wherein the 19$^{th}$ gate grid provides an output circuit comprising a one-fin inverter.

According to embodiments, there is provided a scan flip-flop circuit formed of a plurality of vertical field-effect transistors (VFETs). The scan flip-flop may include: a scan-stage circuit configured to receive at least one scan input signal, at least one data signal, at least one scan enable signal, and at least one inverted scan enable signal; a master latch comprising a 1$^{st}$ inverter configured to receive an output signal of the scan-stage circuit, a master data path circuit configured to receive an output signal of the 1$^{st}$ inverter and at least one reset signal, and a 2$^{nd}$ inverter configured to receive an output signal of the master data path circuit, an output node of the 2$^{nd}$ inverter being connected to the output node of the 1$^{st}$ inverter, a slave latch comprising a 3$^{rd}$ inverter configured to receive an output signal of the 1$^{st}$ data path circuit, a slave data path circuit configured to receive an output signal of the 3$^{rd}$ inverter and at least one reset signal, and a 4$^{th}$ inverter configured to receive an output signal of the slave data path circuit, an output node of the 4$^{th}$ inverter being connected to the output node of the 3$^{rd}$ inverter; and an output circuit configured to receive an output signal of the 2$^{nd}$ data path circuit.

According to embodiments, there is provided a method of designing a vertical field effect transistor (VFET) cell implementing a VFET circuit comprising a plurality of circuits over a plurality of gate grids. The method may include: placing, in the VFET cell, two circuits having a same net, in which a gate signal or a source/drain signal of one circuit is shared by a gate or a source/drain of the other circuit, next to each other, wherein one of the two circuits is an X-contacted poly pitch (CPP) circuit being X CPP wide in the VFET cell, X being an integer greater than 1; changing the X-CPP circuit to an (X−1)-CPP circuit, and removing one gate structure, corresponding to one gate grid, occupied by the X-CPP circuit; and changing internal circuit routing of at least one of the (X−1)-CPP circuit and the other circuit such that a gate signal or a source/drain signal of the other circuit is shared as a gate signal of the (X−1)-CPP circuit

BRIEF DESCRIPTION OF THE DRAWINGS

The above and other aspects of inventive concepts will become more apparent to those of ordinary skill in the art by describing in detail example embodiments thereof with reference to the accompanying drawings, in which:

FIG. 2A illustrates a layout of a VFET cell in which three two-fin inverters are discontinuously placed apart from one another according to a related art;

DETAILED DESCRIPTION

Figure 1A:
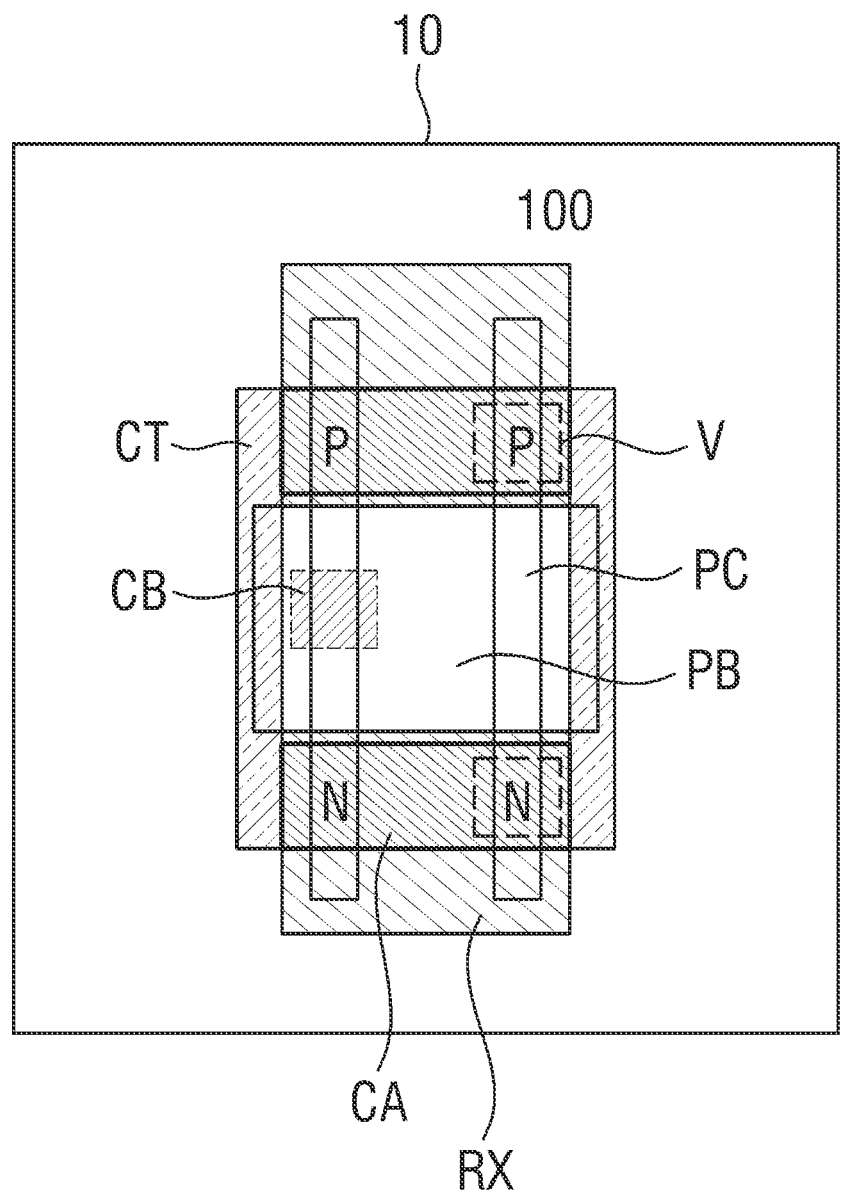
FIG. 1A illustrates a layout of a VFET cell in which a two-fin inverter is formed over two gate structures according to a related art.

Various embodiments of the inventive concept will be described more fully hereinafter with reference to the accompanying drawings. These embodiments are all example embodiments, and may be embodied in many different forms and should not be construed as limiting the inventive concept. Rather, these embodiments are merely provided so that this disclosure will be thorough and complete, and will fully convey the inventive concept to those skilled in the art. In the drawings, the sizes and relative sizes of the various layers and regions may have been exaggerated for clarity, and thus, the drawings are not necessarily to scale, and some features may be exaggerated to show details of particular components or elements. Therefore, specific structural and functional details disclosed herein are not to be interpreted as limiting, but merely as a representative basis for teaching one skilled in the art to variously employ the methods and structures of the embodiments.

An embodiment provided herein is not excluded from being associated with one or more features of another example or another embodiment also provided herein or not provided herein but consistent with the inventive concept. For example, even if matters described in a specific embodiment are not described in a different embodiment, the matters may be understood as being related to or combined with the different embodiment, unless otherwise mentioned in descriptions thereof.

For the purposes of the description hereinafter, the terms "upper", "lower", "top", "bottom", "left," and "right," and derivatives thereof can relate, based on context, to the disclosed structures, as they are oriented in the drawings. The same numbers in different drawings may refer to the same structural component or element thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2B:
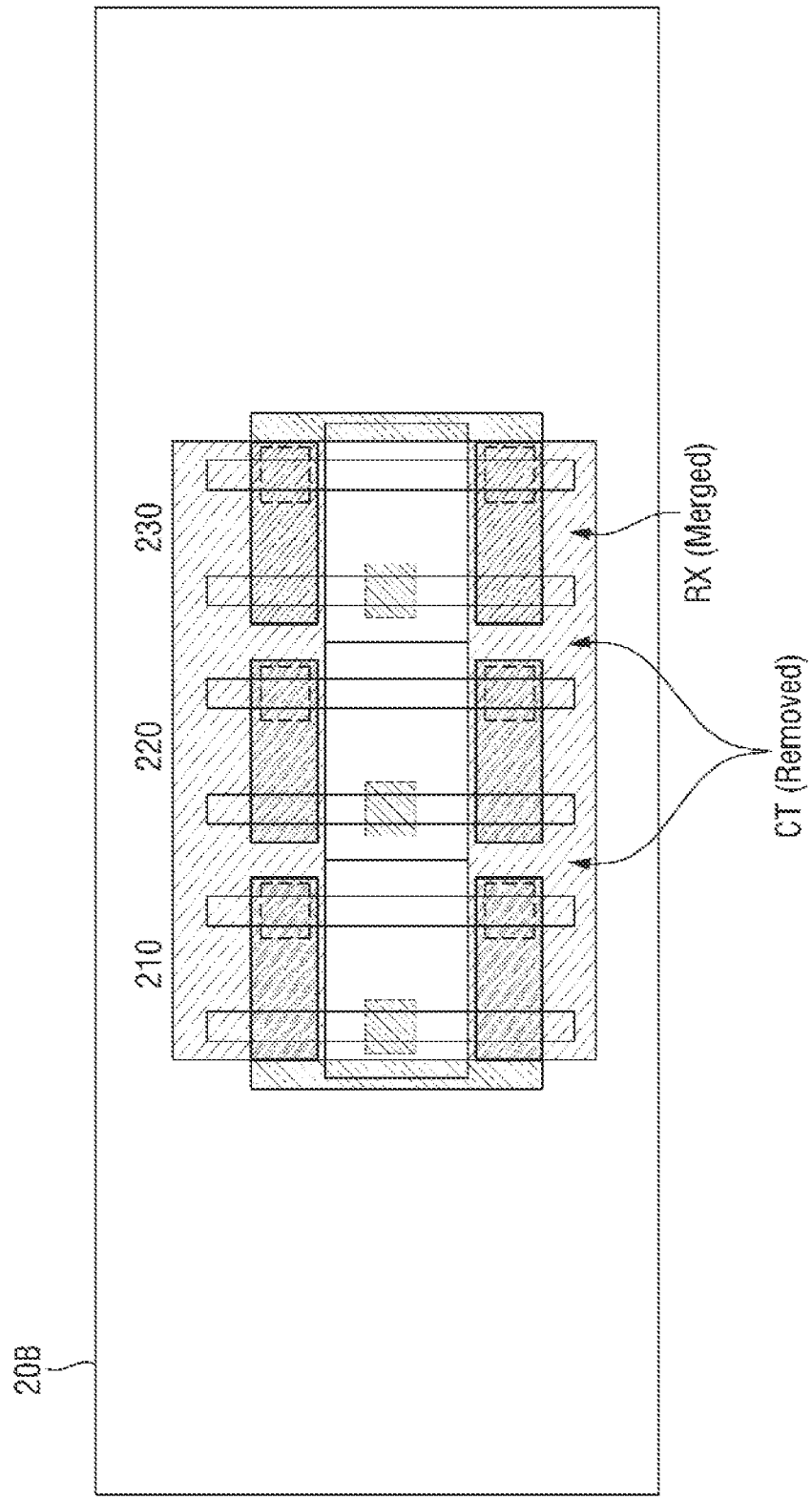
FIG. 2B illustrates a layout of a VFET cell in which three two-fin inverters are sequentially arranged and their bottom source/drain regions are merged, according to an embodiment.

FIG. 2A illustrates a layout of a VFET cell in which three two-fin inverters are discontinuously placed apart from one another according to a related art. FIG. 2B illustrates a layout of a VFET cell in which three two-fin inverters are sequentially arranged and their bottom source/drain regions are merged, according to an embodiment.

It is noted that FIGS. 2A, 2B, and the remaining drawings referred to below are layouts of VFET cells showing top views of the VFET cells, and thus, PMOSs and NMOSs disposed below contact structures or vias are not shown, and thus, indication of PMOS and NMOS in the cell layouts such as in FIG. 1A will be omitted. It is also noted that in these drawings, gate routings, connections between contact structures, metal lines, and vias are omitted for drawing brevity. Further, many of the layouts have the same VFET device structures therein, and thus, the same or duplicate reference characters are omitted.

Referring to FIGS. 2A and 2B, a VFET cell 20A having three two-fin inverters 210, 220 and 230 separately placed therein (FIG. 2A) is converted to a VFET cell 20B in which the two-fin inverters 210, 220 and 230 are rearranged to be placed sequentially in a cell width direction (FIG. 2B). By this arrangement, bottom source/drain regions of the two-fin inverters 210, 220 and 230 can be merged to share a power signal or a ground signal.

Here, it is noted that the foregoing rearrangement of two-fin inverters 210, 220 and 230 and merging the bottom source/drain regions RXs can be possible when these bottom source/drain regions RXs are all connected to a same power source or a same ground source. The structure of each of the two-fin inverters 210, 220 and 230 is substantially the same as that of the two-fin inverter 100 in FIG. 1A, and thus, the descriptions thereof are omitted herein.

In merging the bottom source/drain regions RXs, gate layer cuts CT disposed between the two-fin inverters 210, 220 and 230 can be removed first because two adjacent VFET devices in a cell can have a zero diffusion break (ZDB) therebetween unlike lateral FET devices having a single or double diffusion breaks, and then, the bottom source/drain regions RX of the adjacent VFETs are merged. Thus, it may be possible to reduce a cell width of a VFET cell by merging the bottom source/drain regions connected to the same power source or the same ground source. However, it is noted that the VFET cell 20 still has six gate structures PC for the rearranged two-fin inverters 210, 220 and 230. Thus, merging bottom source/drain regions of VFET devices might not be sufficient to substantially reduce a cell width of a VFET cell.

Figure 3A:
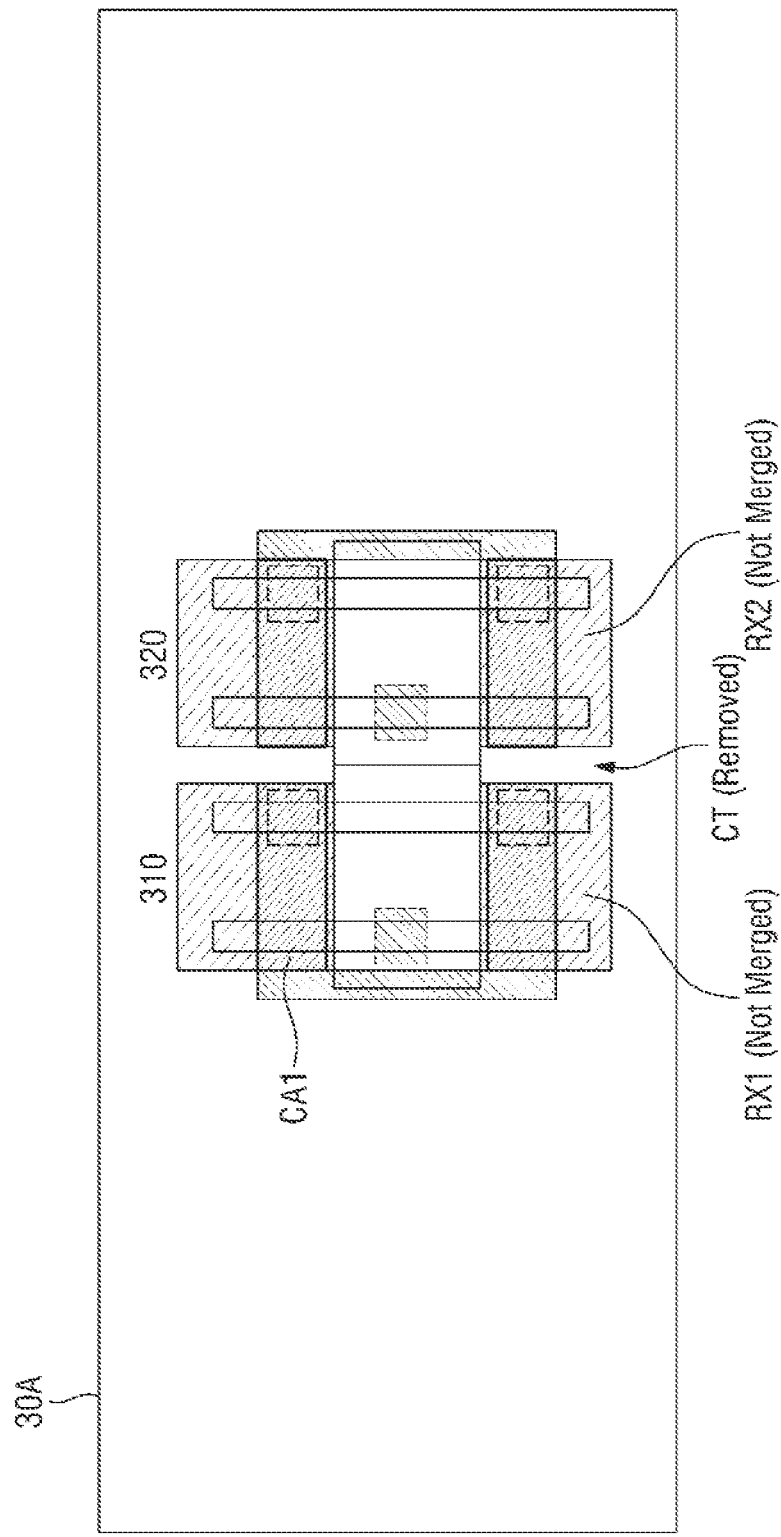
FIG. 3A illustrates a layout of a VFET cell in which two two-fin inverters placed next to each other and gate layer cuts formed therebetween are removed, according to an embodiment.
Figure 3B:
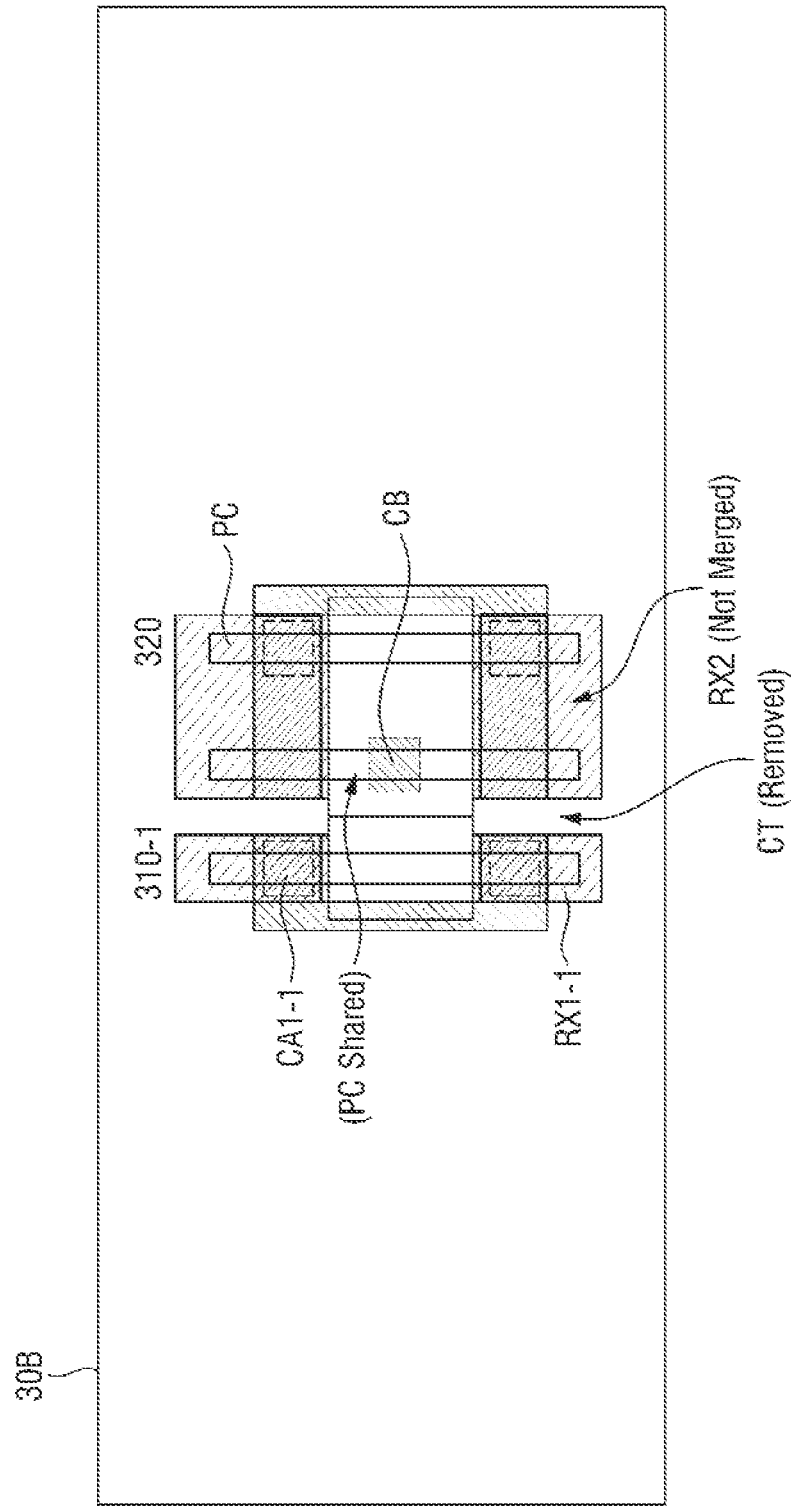
FIG. 3B illustrates a VFET cell in which a one-fin inverter and a two-fin inverter are placed next to each other for a gate of the one-fin inverter to share a gate signal of the two-fin inverter, according to an embodiment.

FIG. 3A illustrates a layout of a VFET cell in which two two-fin inverters placed next to each other and gate layer cuts formed therebetween are removed, according to an embodiment. FIG. 3B illustrates a VFET cell in which a one-fin inverter and a two-fin inverter are placed next to each other for a gate of the one-fin inverter to share a gate signal of the two-fin inverter, according to an embodiment.

Similar to FIG. 2B, FIG. 3A shows that a VFET cell 30A includes two-fin inverters 310 and 320 placed sequentially in a cell width direction, and gate layer cuts CT formed therebetween are removed. Unlike in FIG. 2B, however, FIG. 3A does not show that a bottom source/drain region RX1 of the two-fin inverter 310 and a bottom source/drain region RX2 of the two-fin inverter 320 are merged to share a source/drain signal between adjacent VFETs of the two-fin inverters 310 and 320. This is because the two-fin inverters 310 and 320 are placed next to each other not to merge their bottom source/drain regions but to share a gate signal input to a gate of a VFET of the two-fin inverter 320 as described below.

Referring to FIG. 3B, a VFET cell 30B is generated from the VFET cell 30A to reduce the cell size, i.e., cell width, by changing the two-fin inverter 310 in the VFET cell 30A to a one-fin inverter 310-1 which can share a gate signal of the VFET of the two-fin inverter 320 as its gate signal. This change may be possible because one of two gate structures PC providing for the two-fin inverter 310 in the VFET cell 30A can be removed to change the two-fin inverter 310 to the one-fin inverter 310-1. With the two-fin inverter 310 being changed to the one-fin inverter 310-1, a gate of a VFET of the one-fin inverter 310-1 can use the gate signal input to a gate of a VFET in the two-fin inverter 320 through a gate contact structure CB formed on a gate structure PC right next to the one-fin inverter 310-1.

Herein, a VFET circuit such as a one-fin inverter sharing, as its gate signal, a gate signal or a source/drain signal of another VFET circuit may refer to a VFET circuit using the gate signal or the source/drain signal of the other VFET circuit as its gate signal.

Further, in FIG. 3B, as one of the two gate structures PC is removed, a bottom source/drain region RX1 and a top source/drain contact structure CA1 in the VFET cell 30A are changed to a bottom source/drain region RX1-1 having a narrower width and a top source/drain contact structure CA1-1 having a narrower width, respectively.

However, it is noted that, in the VFET cell 30B of FIG. 3B, the bottom source/drain regions RX–1 and RX2 may not be merged when the one-fin inverter 310-1 and the two-fin inverter 320 are connected to a power source or a ground source through different connection structures such as a bottom source/drain region and a top source/drain contact structure. Thus, as shown in FIG. 3B, even if one gate structure PC can be removed because the one-fin inverter 310-1 can share the gate signal of the two-fin inverter 320, the bottom source/drain region RX1-1 of the one-fin inverter 310-1 may not be merged with the bottom source/drain regions RX2 of the two-fin inverter 320. Further, if the bottom source/drain regions RX1-1 and RX2 cannot be merged for the foregoing reason, the one-fin inverter 310-1 will be left with the narrow bottom source/drain region RX1-1 and smaller top source/drain contact structure CA1-1 which are difficult to pattern in manufacturing the VFET cell 30B.

In the above two embodiments, a VFET cell can be designed to have a VFET device use a merged bottom source/drain region (FIGS. 2A and 2B) or share a gate signal of an adjacent VFET (FIGS. 3A and 3B). However, the following embodiments may enable two adjacent VFETs not only to have a merged bottom source/drain regions but also share a gate signal of one VFET to improve optimization of a VFET cell architecture by reducing the number of gate structures without resulting in a narrow bottom source/drain region like the bottom source/drain region RX1-1 in FIG. 3B.

FIGS. 4A through 4D illustrate steps of designing a VFET cell having a reduced number of gate structures and sharing a gate signal and a source/drain signal between VFETs in the VFET cell, according to an embodiment.

Figure 4A:
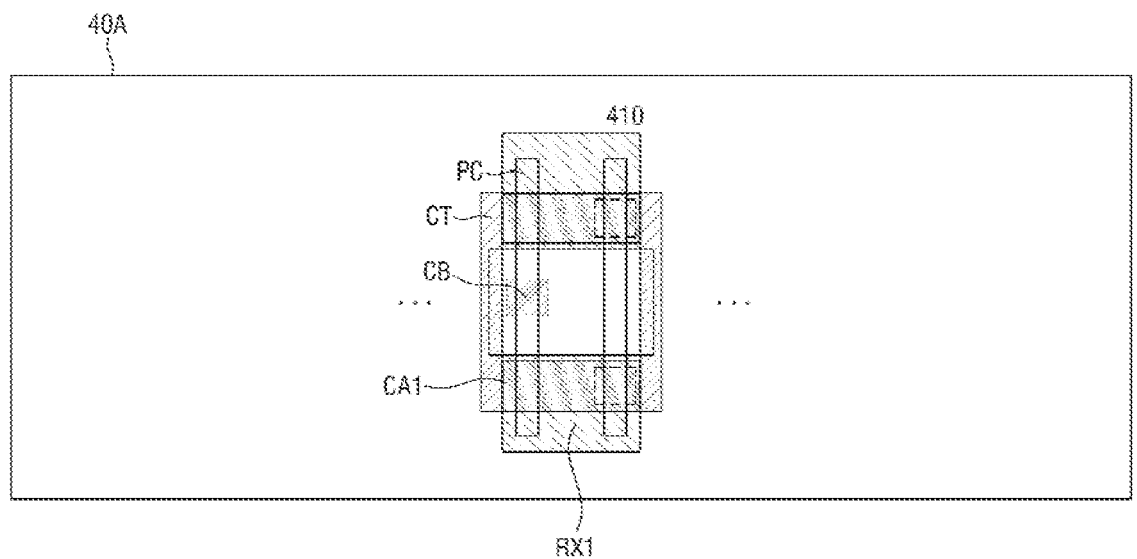
FIGS. 4A through 4D illustrates steps of designing a VFET cell having a reduced number of gate structures and sharing a gate signal and a source/drain signal between VFETs in the VFET cell, according to an embodiment.

FIG. 4A shows a VFET cell 40A in which a two-fin inverter 410 is placed at a predetermined position among a plurality circuits.

Figure 4B:
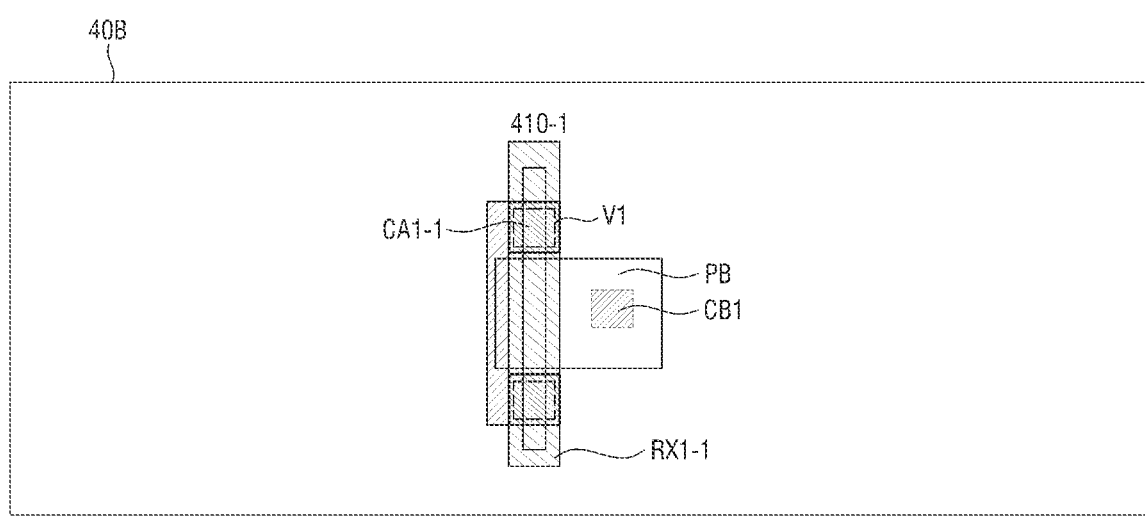

FIG. 4B shows that the VFET cell 40A is converted to a VFET cell 40B in which the two-fin inverter 410 in the VFET cell 40A is moved to be placed at a position where the two-fin inverter 410 can share, as its gate signal, a gate signal input to a gate of a VFET included in another circuit 420 (FIG. 4D) in the VFET cell 40B, and then, the two-fin inverter 410 is changed to a one-fin inverter 410-1 by removing one of two gate structure PC and converting bottom source/drain regions RX1 and top source/drain contact structures CA1 of VFETs in the two-fin inverter 410 to bottom source/drain regions RX1-1 and top source/drain contact structures CA1-1 of the VFETs as shown in FIG. 4B. In this step, a gate layer cut CT disposed on the right side of the two-fin inverter 410 (FIG. 4A) is removed, and a gate contact structure CB formed on one of two gate structures PC (FIG. 4A) is also removed to share a gate contact structure CB1 formed on a gate structure PC of the circuit 420 (FIG. 4D) next to which the one-fin inverter 410-1 is to be placed. By sharing the gate contact structure CB1, the one-fin inverter 410-1 may be able to share, as its gate signal, the gate signal input to the gate of the VFET of the circuit 420 through the gate contact structure CB1 as described again in reference to FIG. 4D below.

Figure 1B:
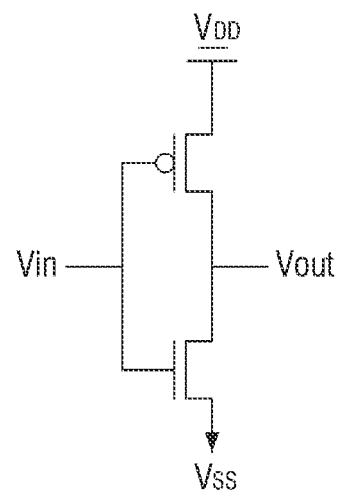
FIG. 1B illustrates a schematic of an inverter which can be formed of one PMOS and one NMOS.
Figure 1C:
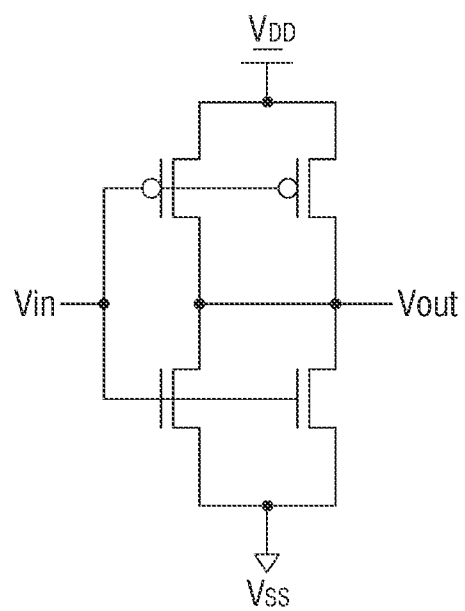
FIG. 1C illustrates a schematic of an inverter which can be formed of two PMOSs and two NMOSs.
Figure 4C:
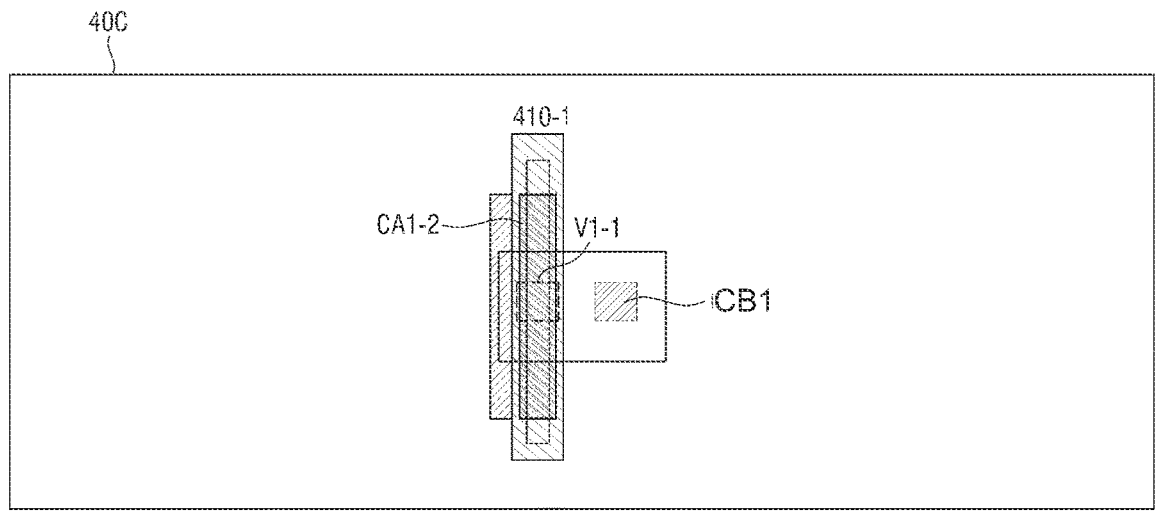

FIG. 4C shows the VFET cell 40B is converted to a VFET cell 40C in which two top source/drain contact structures CA1-1 of respective VFETs, that is, PMOS and NMOS, of the one-fin inverter 410-1, are replaced with one single extended top source/drain contact structure CA1-2 having an extended length to enable easier patterning during manufacturing of the VFET cell 40C. This configuration is possible due to the circuit structure of an inverter in which a drain of a PMOS and a drain of an NMOS are connected to each other as shown in FIG. 1B. Further, as the two top source/drain contact structures CA1-1 are converted to the single extended top source/drain contact structure CA1-2, the VFET cell 40C needs only one via V1-1 connected to the single extended top source/drain contact structure CA1-2, instead of two vias V1 connected to two top source/drain contact structures CA1-1, to transmit an output signal of the one-fin inverter 410-1.

Figure 4D:
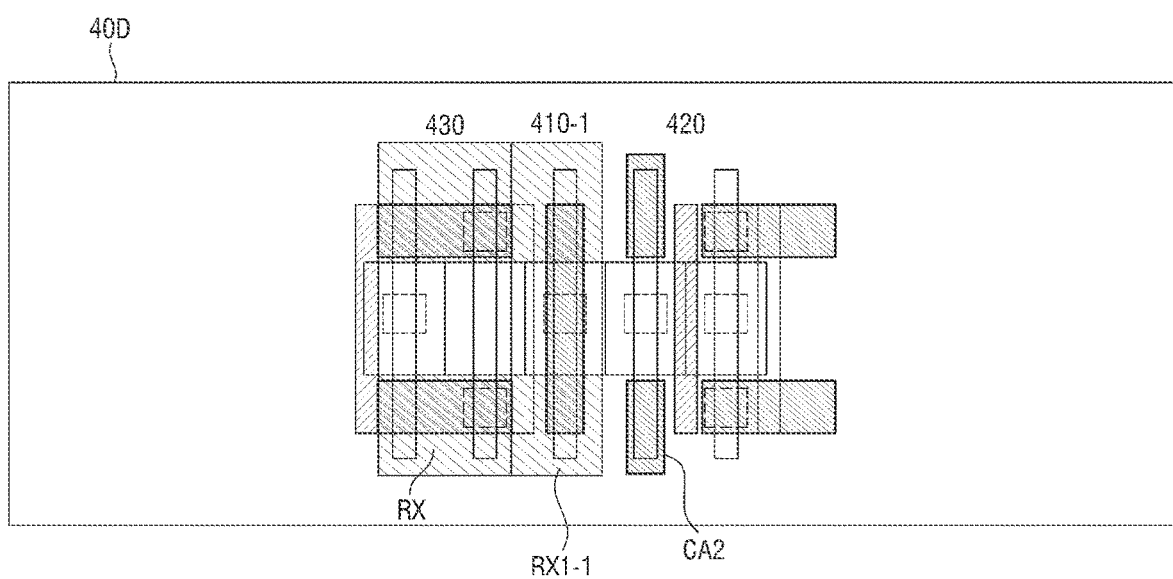

FIG. 4D shows the VFET cell 40C is converted to a VFET cell 40D in which the one-fin inverter 410-1 shares, as its gate signal, the gate signal of the VFET included in the circuit 420 placed next to the one-fin inverter 410-1 to the right direction. Further, in the VFET cell 40D, a two-fin inverter 430, which was discontinuously placed apart from the two-fin inverter 410, is moved to be placed next to the one-fin inverter 410-1 to the left direction so that the bottom source/drain region RX1-1 of the one-fin inverter 410-1 can be merged with a bottom source/drain region RX of the two-fin inverter 430 in the VFET cell 40D to be connected to a ground source in common.

It is noted that, in the VFET cell 40D, merging the bottom source/drain regions RX−1 and RX between the one-fin inverter 410-1 and the two-fin inverter 430 is possible because the one-fin inverter 410-1 and the two-fin inverter 430 are both connected to a power source and a ground source through same connection structures, that is, respective bottom source/drain regions. For this reason, the bottom source/drain region RX1-1 of the one-fin inverter 410-1 may not be merged with a bottom source/drain region, if any, of the circuit 420 which uses top source/drain contact structures CA2 as connector to the power source and the ground source.

Thus, according to the present embodiment, the one-fin inverter 410-1 shares, as its gate signal, the gate signal of the VFET of the circuit 420 placed on its right side, and further, its bottom source/drain region RX1-1 is merged with the bottom source/drain region of two-fin inverter 430 on its left, thereby better being able to optimize a VFET cell compared to the embodiments of FIGS. 2A-2B and FIGS. 3A-3B.

Figure 5:
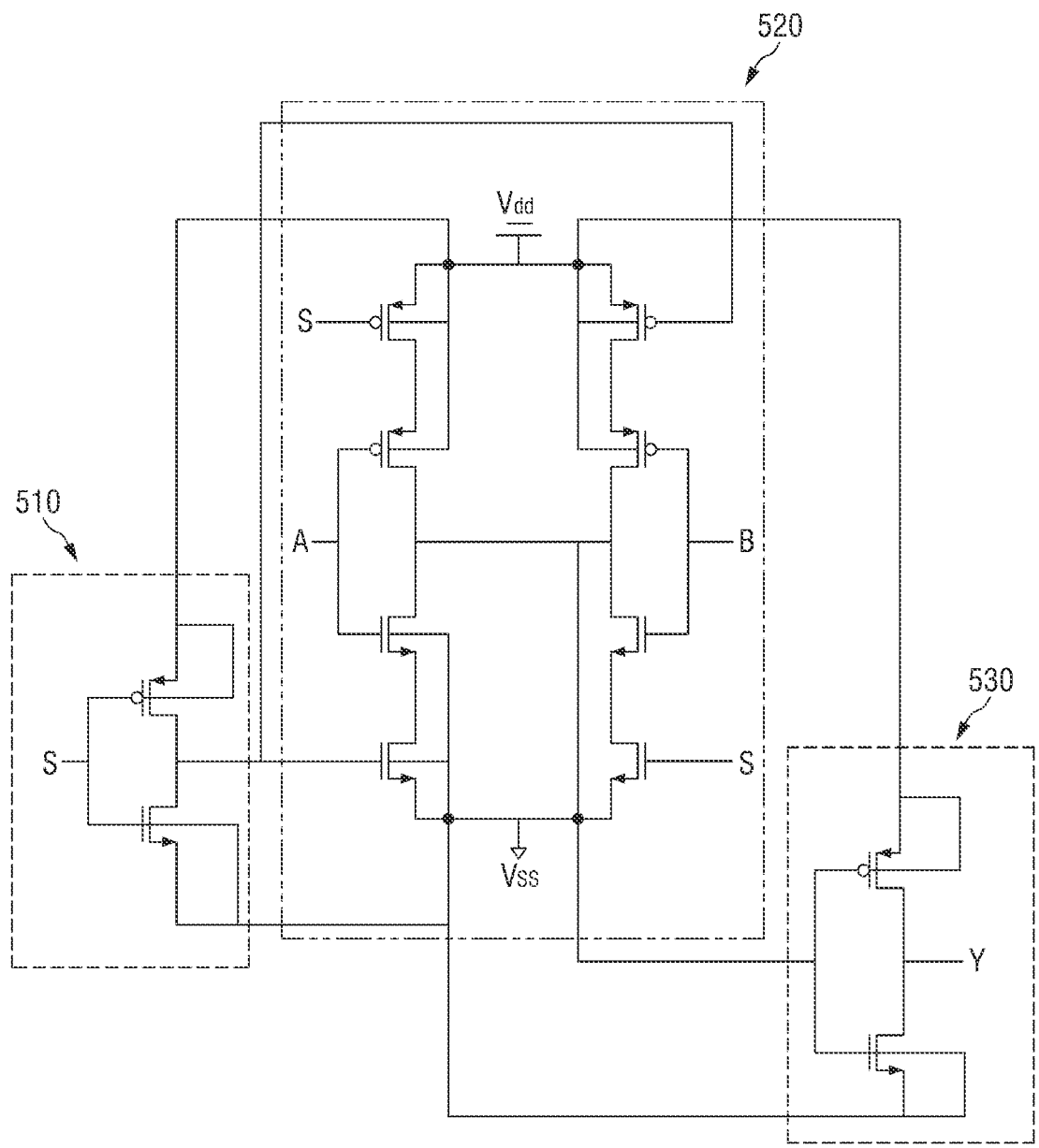
FIG. 5 illustrates a schematic of a multiplexer formed of a plurality VFET circuits, according to an embodiment.

FIG. 5 illustrates a schematic of a multiplexer formed of a plurality VFET circuits, according to an embodiment.

Referring to FIG. 5, a multiplexer 50 includes an input circuit 510 formed of an inverter, a cross-couple circuit 520 in which four PMOSs and four NMOSs are cross-coupled, and an output circuit 530 formed of another inverter. The multiplexer 50 is configured to receive a select/non-select signal S at the input circuit 510, receive input signals A and B and the select/non-select signal S at the cross-couple circuit 520, and transmit an output signal Y at the output circuit 530.

FIGS. 6A through 6D illustrate VFET cell layouts implementing a multiplexer in which a gate signal and a source/drain signal are shared, according to an embodiment. The VFET cell layouts shown in FIGS. 6A through 6D implement the multiplexer 50 shown in FIG. 5

Figure 6A:
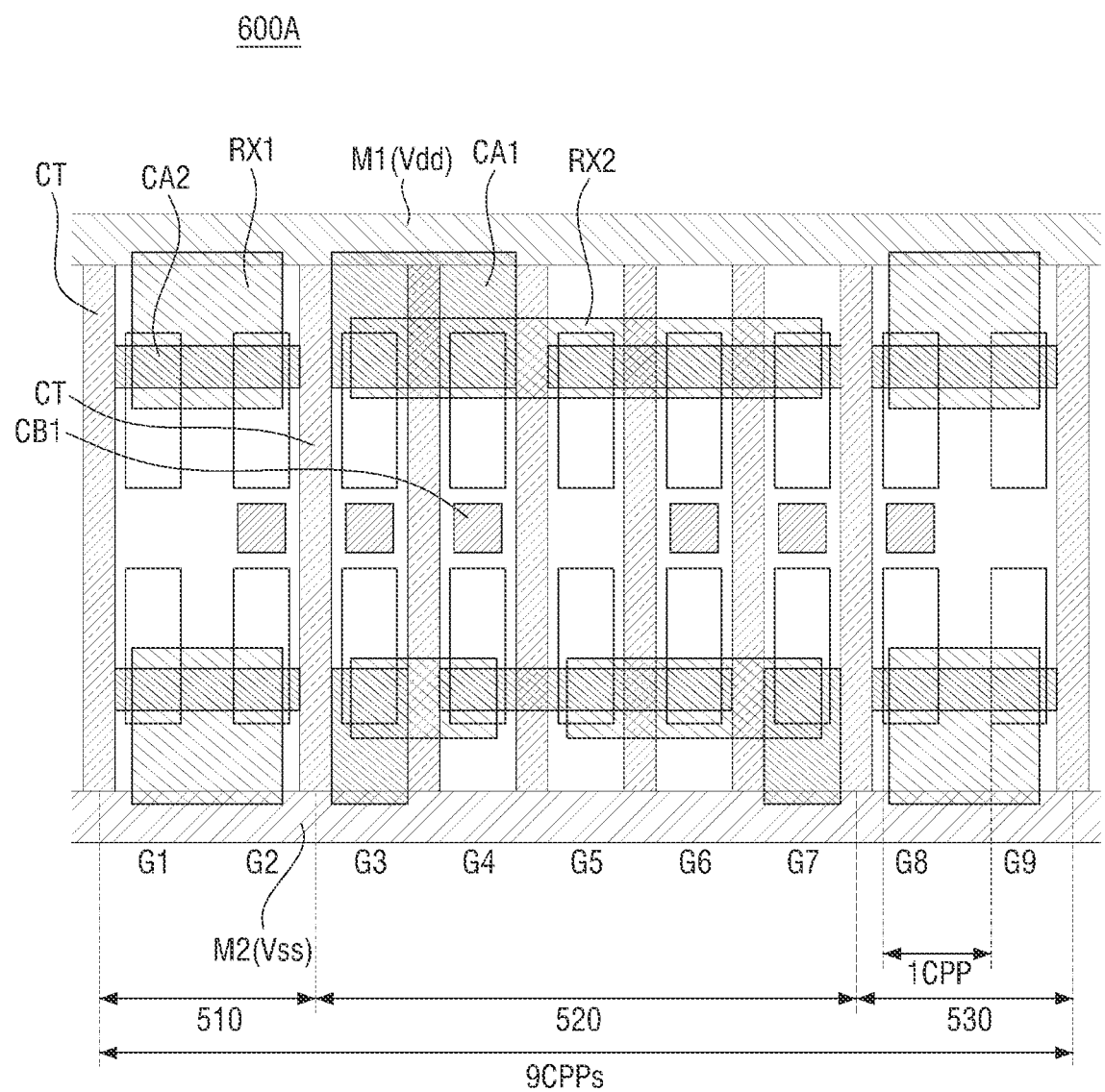
FIGS. 6A through 6D illustrate VFET cell layouts implementing a multiplexer in which a gate signal and a source/drain signal are shared, according to an embodiment.

Referring to FIG. 6A, a multiplexer cell 600A provides the multiplexer 50 of FIG. 5 over nine gate grids (or stripes) G1 through G9 which are consecutively formed and evenly spaced therein. Each grid corresponds to a gate structure PC shown in FIG. 1A, and includes two sub-grids provided for a PMOS and an NMOS, respectively, in a vertical direction. In the multiplexer cell 600A, the input circuit 510 of the multiplexer 50 is provided as a two-fin inverter over the gate grids G1 and G2, and the cross-couple circuit 520 of the multiplexer 50 is provided over the gate grids G3 through G7. In addition, the output circuit 530 of the multiplexer 50 is provided as a two-fin inverter over the gate grids G8 and G9 in the multiplexer cell 600A.

It is noted from FIG. 6A and the other cell layouts referred to herebelow that a cell width of a VFET cell is measured in a unit of gate grid described above and/or contacted poly pitch (CPP). One CPP indicates a horizontal length between a left edge (right edge or a center) of a gate grid and a left (right edge or a center) of an adjacent gate grid. Thus, the multiplexer cell 600A is nine CPP wide when including a length occupied by gate layer cuts formed at the left side and the right side of the multiplexer cell 600A. Further, the two-fin inverter provided over the two gate grids G1 and G2 may be referred to as a 2-CPP inverter, and a one-fin inverter may be referred to as 1-CPP inverter herein.

FIG. 6A also shows that the multiplexer cell 600A includes power rails M1 and M2 respectively connected to a power source and a ground source, a plurality bottom source/drain regions RX1 connected to the power rails M1 and M2, a plurality bottom source/drain regions RX2 connecting bottom source/drains of VFETs, a plurality top source/drain contact structures CA1 connected to the power rails M1 or M2, and a plurality top source/drain contact structures CA2 connecting top source/drains of the VFETs. Further, the multiplexer cell 600A includes a plurality gate structures CB1 receiving gate signals of the VFETs and a plurality gate layer cuts CT disposed between and at the sides of the nine gate grids.

Figure 6B:
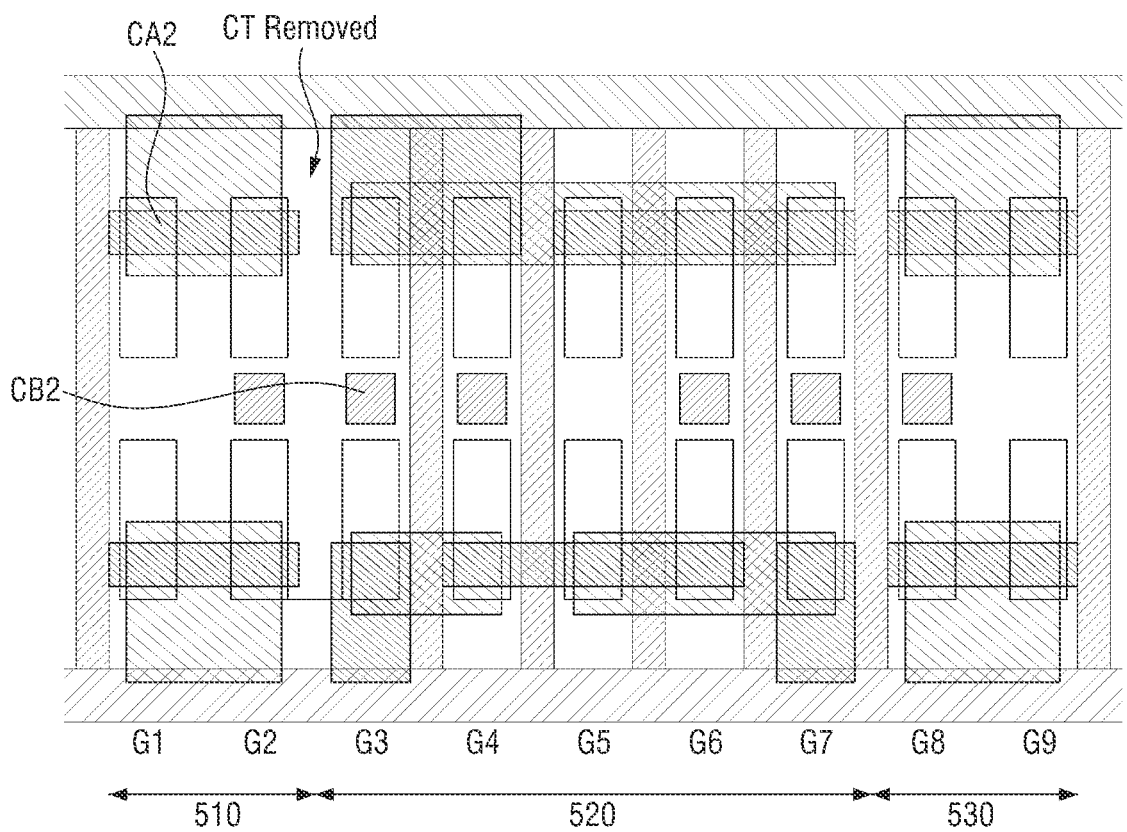

FIG. 6B shows a multiplexer cell 600B which is converted from the multiplexer cell 600A by rearranging gates of the input circuit 510 and the cross-couple circuit 520, and removing a gate layer cut CT formed between the input circuit 510 and the cross-couple circuit 520. Specifically, in the cross-couple circuit 520 of the multiplexer cell 600B, a gate structure CB2 on the gate grid G3 is changed to receive a gate signal input through a gate structure CB1 on the gate grid G4 in the multiplexer cell 600A so that a gate signal input the changed gate structure CB2 on the gate grid G3 can be shared with the input circuit 510. For this gate sharing, the gate layer cut CT between the gate grids G2 and G3 in the multiplexer cell 600A is removed to enable gate rerouting between the input circuit 510 and the cross-couple circuit 520.

Figure 6C:
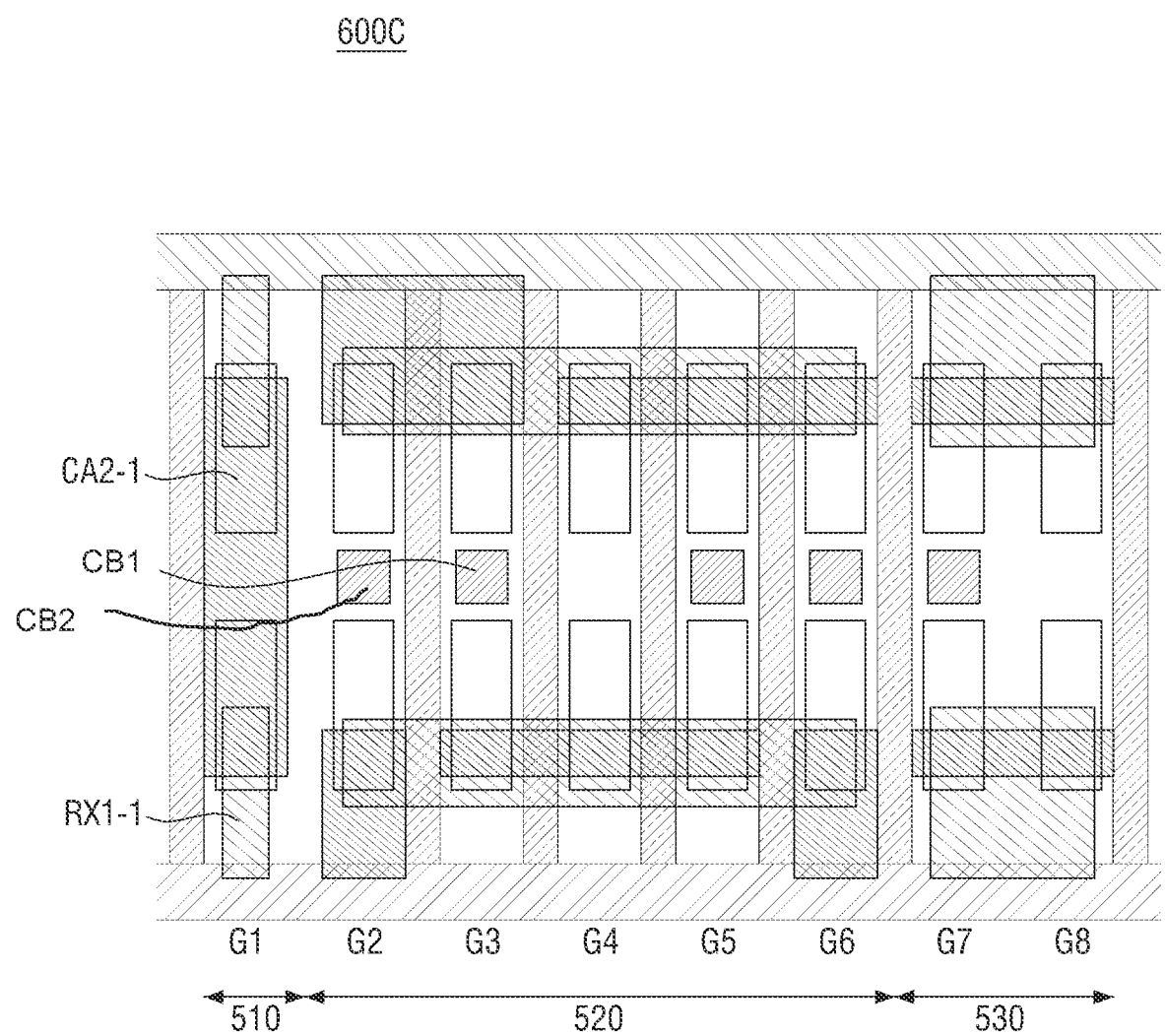

FIG. 6C shows a multiplexer cell 600C is converted from the multiplexer cell 600B by changing the two-fin inverter of the input circuit 510 to one-fin inverter. Specifically, the two-fin inverter of the input circuit 510 provided over the gate grids G1 and G2 is changed to a one-fin inverter provided over the gate grid G1 which shares, as its gate signal, the gate signal of the cross-couple circuit 520 input through the gate structure CB2 which is now formed on the gate grid G2. Further, two top source/drain contact structures CA2 provided over the gate grids G1 and G2 in the multiplexer cell 600B is changed to a single extended top source/drain contact structure CA2-1. By this cell conversion, the multiplexer 50 is now implemented over eight gate grids G1 through G8 by reducing one gate grid from the nine gate grids of the multiplexer cells 600A and 600B. However, as noted earlier in the previous embodiments shown in FIGS. 4C and 4D, the multiplexer cell 600C now has narrow bottom source/drain regions RX1-1 for the input circuit 510 as the two-fin inverter of the input circuit 510 is converted to a one-fin inverter.

Figure 6D:
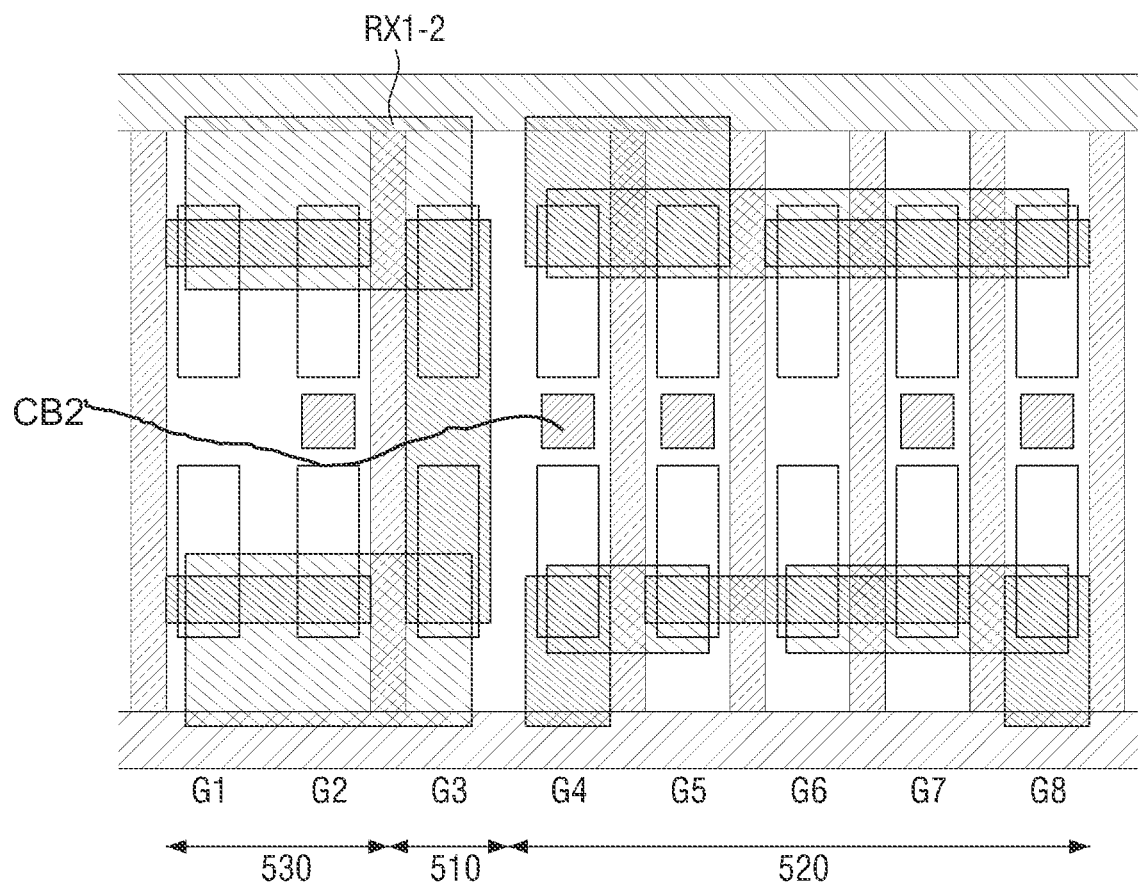

FIG. 6D shows a multiplexer cell 600D which is converted from the multiplexer cell 600C to address the narrow bottom source/drain regions RX1-1 of the multiplexer cell 600C. Considering that the narrow bottom source/drain regions RX1-1 are connected to the power rails M1 and M2, the output circuit 530 also having bottom source/drain regions RX1 connected to the power rails M1 and M2 are now repositioned at the left side of the input circuit 510 so that the narrow bottom source/drain regions RX1-1 of the input circuit 510 can be merged with the bottom source/drain regions RX of the output circuit 530 to form merged bottom source/drain regions RX1-2.

As described above, the present embodiment enables design of a multiplexer cell formed of a plurality VFETs to have a smaller number of gate grids and CPPs, that is, a reduced cell width by having at least one gate signal be shared between adjacent circuits in the multiplexer cell thereby at least one gate structure being removed. Further, the multiplexer cell designed according to the present embodiment enables easier patterning of merged bottom source/drain regions and an extended top source/drain contact structure of a VFET.

The inventive concept implemented in the above embodiment of a multiplexer cell also applies to flip-flop circuits similarly having a number of inverters and cross-couple circuits as described below.

It is noted from the above embodiments that in designing a VFET circuit, certain types of VFET arrangement needs to be avoided in the VFET circuit in order to avoid increase of an area of a VFET cell implementing the VFET circuit, and in order to implement sharing of at least one gate signal or at least one source/drain between VFETs in the VFET cell. For example, FIG. 7A through 7D illustrates such VFET arrangements that need to be avoided, according to embodiments.

Figure 7A:
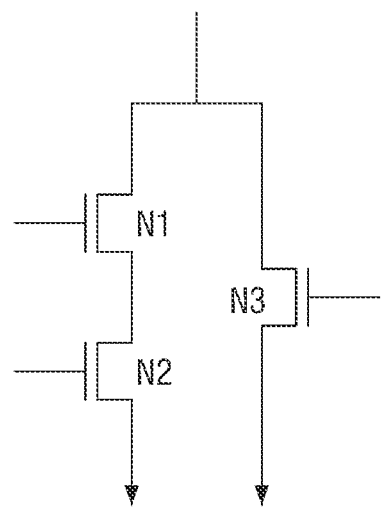
FIG. 7A through 7D illustrates VFET arrangements that need to be avoided, according to embodiments.

FIG. 7A illustrates a first VFET arrangement to avoid, in which a drain end of an even number of VFETs having the same polarity and connected in series (e.g., two NMOSs N1 and N2) is connected to a drain end of one or an odd number of VFETs having the same polarity as the even number of VFETs and connected in series (e.g., one NMOS N3), where a source end of the even number of VFETs and a source end of the one or odd number of VFETs are connected to the same power source or ground source. It is noted that this VFET arrangement also applies to PMOSs included in a circuit.

Figure 7B:
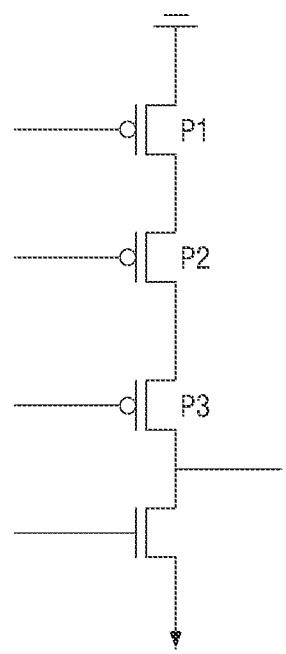
Figure 7C:
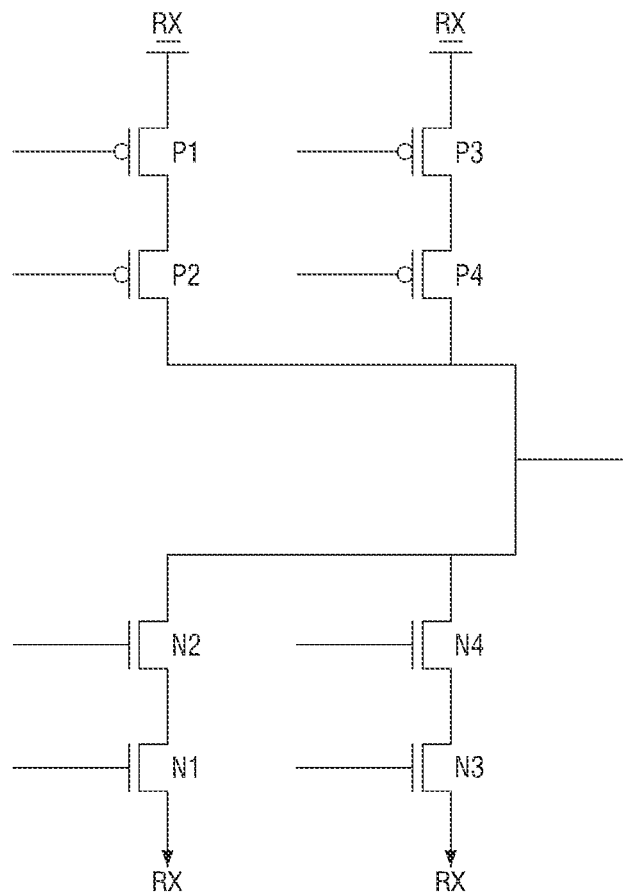

FIG. 7B illustrates a second VFET arrangement to avoid, in which three or more PMOSs P1, P2 and P3 (or NMOSs) are connected in series from an output node of a circuit;

FIG. 7C illustrates a third VFET arrangement to avoid, in which a power source or a ground source is connected to a circuit through only bottom source/drain regions of PMOSs P1 to P4 and NMOSs N1 to N4 when implemented in a VFET cell.

Figure 7D:
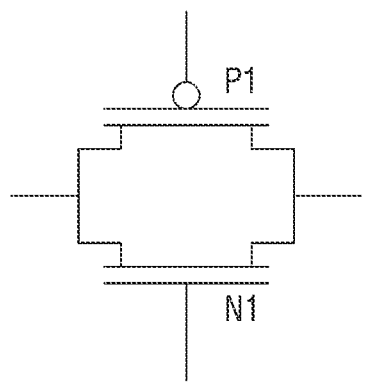

FIG. 7D illustrates a fourth VFET arrangement to avoid, in which a transmission gate is included in a sub-circuit. The transmission gate is a combination of a PMOS and an NMOS connected in parallel such that only drains and sources of the two VFETs are connected together.

Thus, the VFET circuits and the VFET cells described in the embodiments herein are designed to avoid at least one of the above-listed VFET arrangements.

Figure 8:
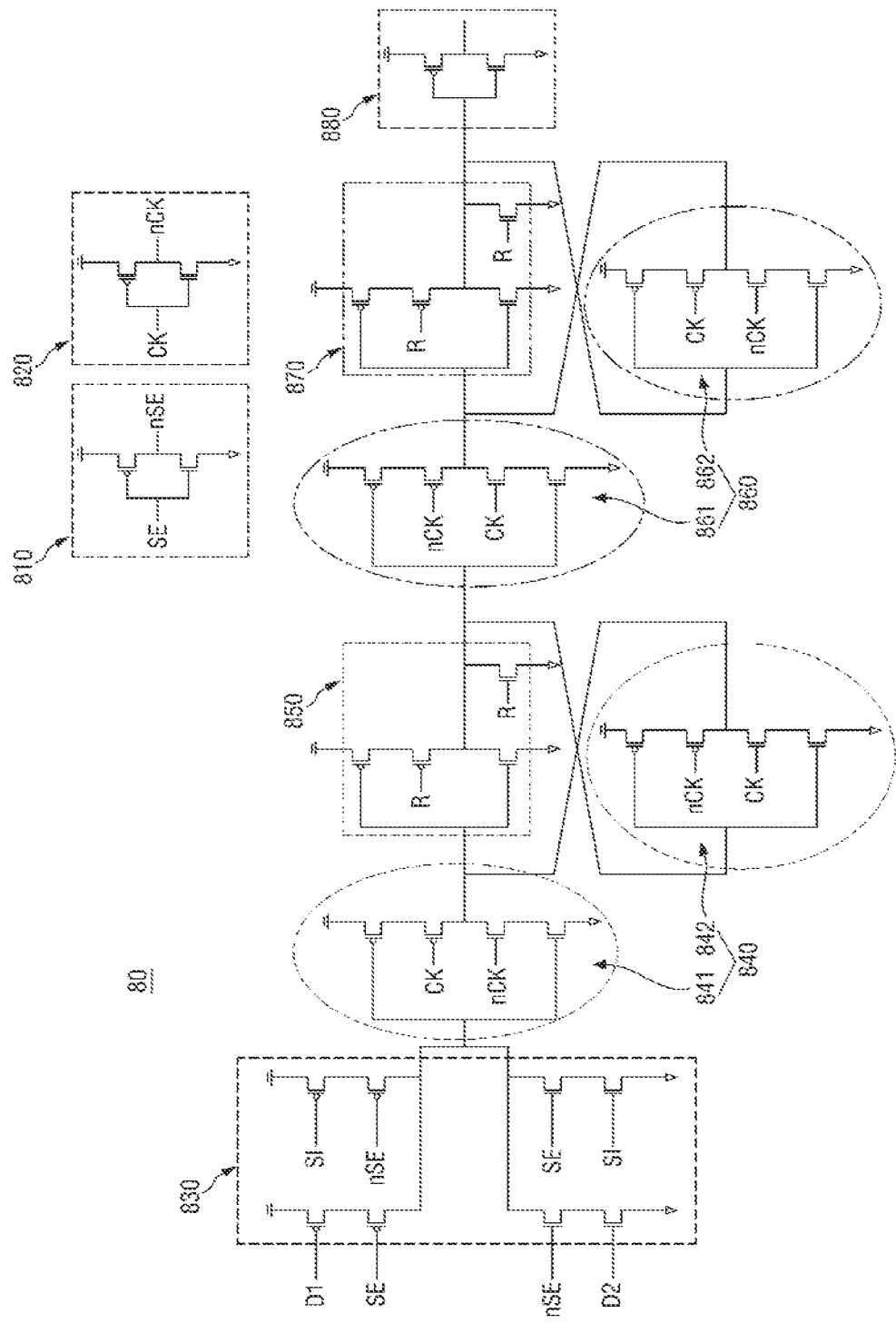
FIG. 8 illustrates a schematic of a scan-enabled flip-flop with a reset input (SDFFRPQ circuit) formed of a plurality of VFETs, according to an embodiment.

FIG. 8 illustrates a schematic of a scan-enabled flip-flop with a reset input (hereafter referred to as "SDFFRPQ circuit") formed of a plurality of VFETs, according to an embodiment.

Referring to FIG. 8, an SDFFRPQ circuit 80 includes a scan inverter 810, a clock inverter 820, a scan stage circuit 830, a master latch 840, a master data path circuit 850, a slave latch 860, a slave data path circuit 870, and an output circuit 880.

Although the master latch 840 along with the master data path circuit 850 may be referred to as a master latch, the two circuits are differently termed for description purposes hereinbelow including the descriptions about FIGS. 9A through 11C. Likewise, although the slave latch 860 along with the slave data path circuit 870 along may be referred to as a slave latch, the two circuits are differently termed for description purposes herebelow including FIGS. 9A through 11C.

The scan stage circuit 830 includes a first set of two PMOSs and two NMOSs connected in series between a power source and a ground source to respectively receive a data signal D1, a scan enable signal SE, an inverted scan enable signal nSE and a data signal D2. A drain of a PMOS and a drain of an NMOS connected to each other in series in the first set are connected to an input node of the master latch 840.

The scan stage circuit 830 also includes a second set of two PMOSs and two NMOSs connected in series between the power source and the ground source to respectively receive a scan input signal SI, the inverted scan enable signal nSE, the scan enable signal SE and the scan input signal SI. A drain of a PMOS and a drain of an NMOS connected to each other in series in the second set are also connected to the input node of the master latch 840.

The master latch 840 includes a tri-state inverter 841 receiving an output signal of the scan stage circuit 830, and a tri-state inverter 842 of which an output node is connected to an output node of the tri-state inverter 841. Each of the tri-state inverter 841 and the tri-state inverter 842 receives a clock signal CK and an inverted clock signal nCK.

According to an embodiment, the master data path circuit 850 delivering an output signal of the master latch 840 to the slave latch 860 is configured by a NOR circuit formed of two PMOSs and two NMOSs. Here, one PMOS and one NMOS receive a reset signal R, and the other PMOS and the other NMOS are gated to output nodes of the tri-state inverters 841 and 842 of the master latch 840 to receive an output signal of the tri-state inverter 841 or 842 as their gate input signal. The two PMOSs are connected in series with a source of one PMOS connected to a power source, and a drain of the other PMOS is connected to drains of the two NMOSs connected in parallel between an output node of the master data path circuit 850 and a ground source. The master data path circuit 850 delivers its output signal to the slave latch 860, and also feedback to an input node of the tri-state inverter 842 of the master latch 840.

The slave latch 860 includes a tri-state inverter 861 receiving the output signal of the master data path circuit 850, and a tri-state inverter 862 of which an output node is connected to an output node of the tri-state inverter 861. Each of the tri-state inverter 861 and the tri-state inverter 862 receives a clock signal CK and an inverted clock signal nCK.

According to an embodiment, the slave data path circuit 870 delivering an output signal of the slave latch 860 to the output circuit 880 is also configured by a NOR circuit formed of two PMOSs and two NMOSs. Here, one PMOS and one NMOS receive a reset signal R, and the other PMOS and the other NMOS are gated to output nodes of the tri-state inverters 861 and 862 of the slave latch 860 to receive an output signal of the tri-state inverter 861 or 862 as their gate input signal. The two PMOSs are connected in series with a source of one PMOS connected to a power source, and a drain of the other PMOS is connected to drains of the two NMOSs connected in parallel between an output node of the slave data path circuit 870 and a ground source. The slave data path circuit 870 delivers its output signal to the output circuit 880, and also feedback to an input node of the tri-state inverter 862 of the slave latch 860.

The output circuit 880 is configured by an inverter.

According to the present embodiment, the SDFFRPQ circuit 80 shown in FIG. 8 is designed not to include any of the above-listed VFET arrangements shown in FIGS. 7A through 7D that may cause increase of a cell area in a VFET cell so that at least one gate signal and at least one source/drain signal can be shared in a SDFFRPQ cell implementing the SDFFRPQ circuit 80.

Figure 9A:
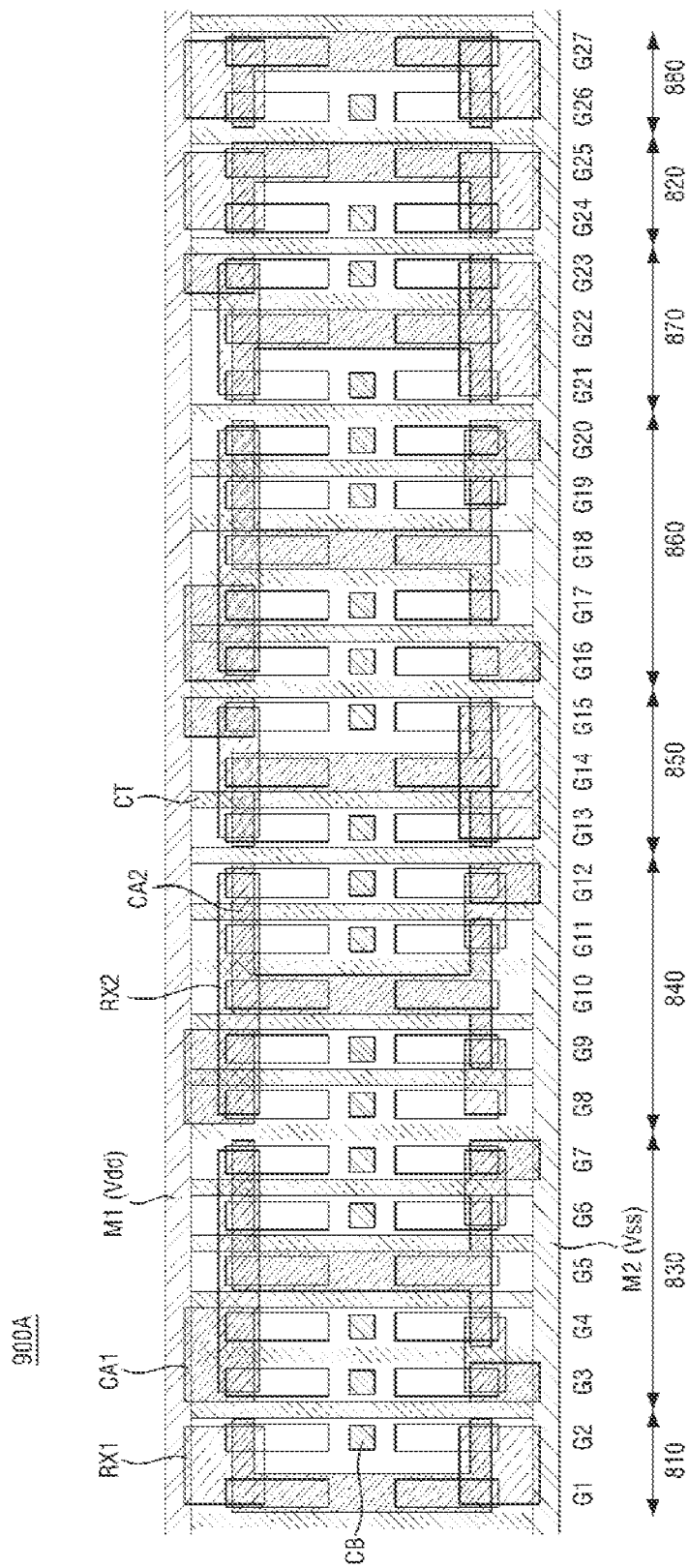
FIGS. 9A through 9C illustrate VFET cell layouts implementing an SDFFRPQ circuit in which at least one gate signal and at least one source/drain signal are shared between sub-circuits, according to embodiments.
Figure 9B:
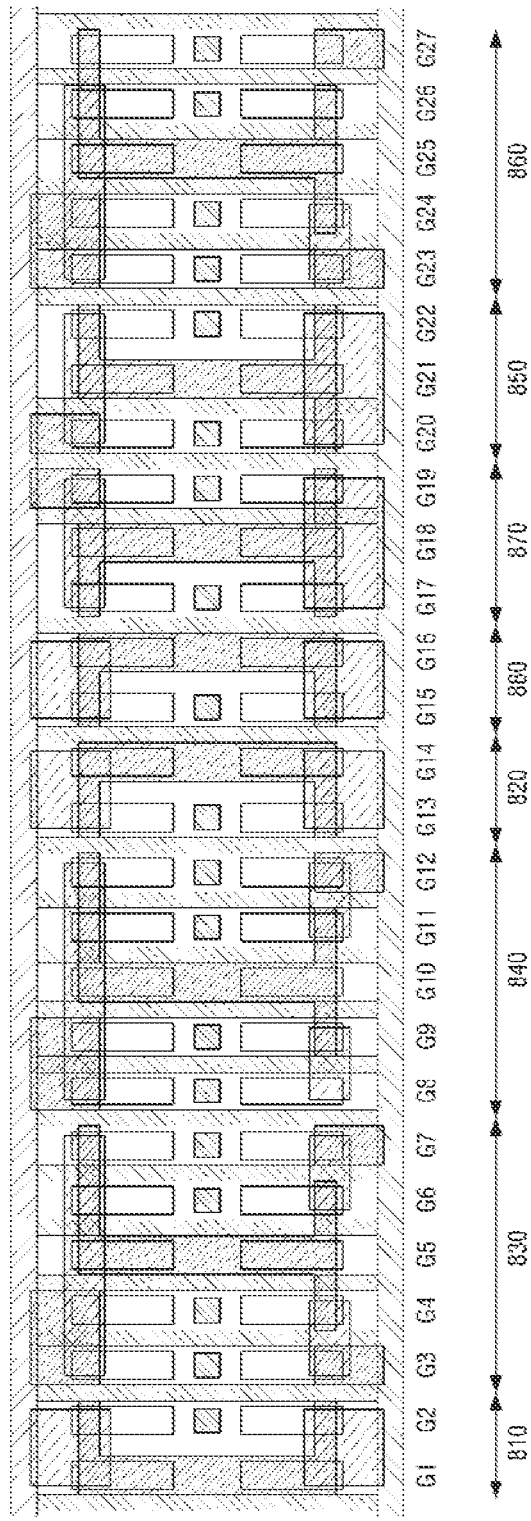
Figure 9C:
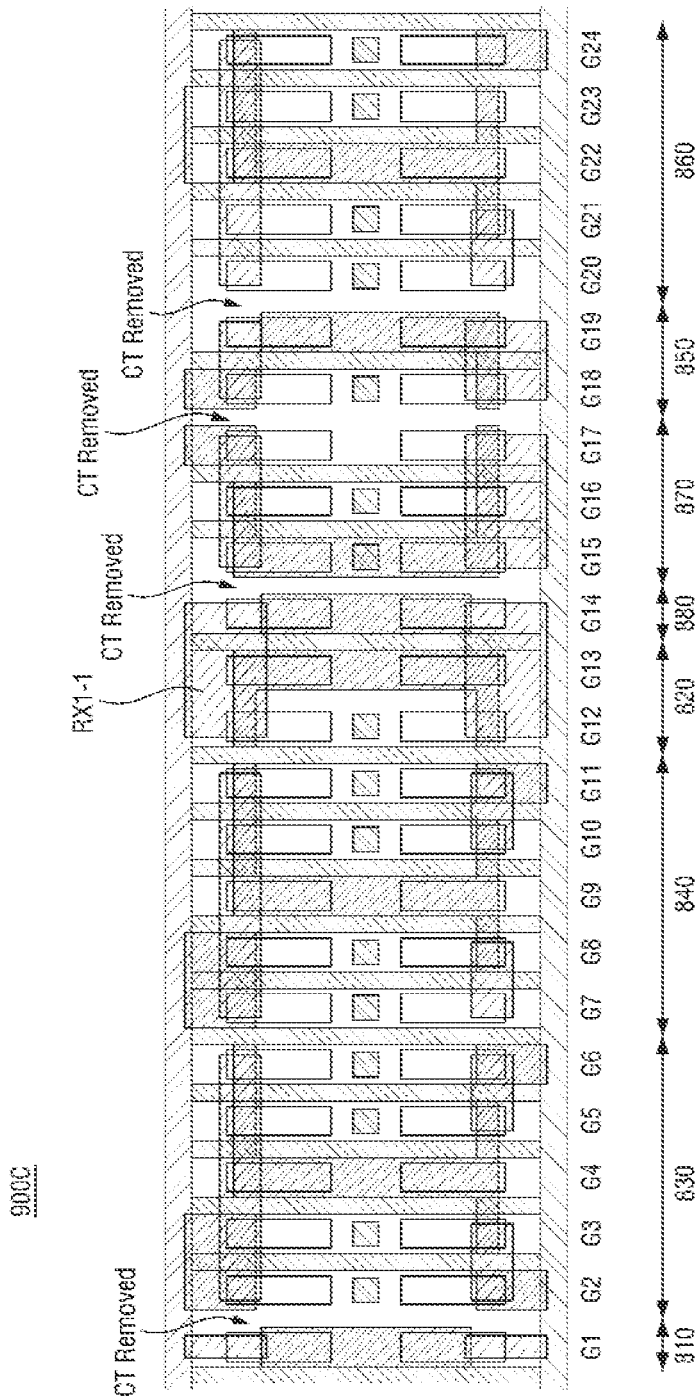

FIGS. 9A through 9C illustrate VFET cell layouts implementing an SDFFRPQ circuit in which at least one gate signal and at least one source/drain signal are shared between sub-circuits, according to embodiments. The VFET cell layouts of FIGS. 9A through 9C implement the SDFFRPQ circuit 80 shown in FIG. 8.

Referring to FIG. 9A, an SDFFRPQ cell 900A provides the SDFFRPQ circuit 80 of FIG. 8 over 27 gate grids G1 through G27 which are consecutively formed and evenly spaced therein. Thus, the SDFFRPQ cell 900A is 27 CPP wide when including a length occupied by gate layer cuts formed at the left side and the right side of the SDFFRPQ cell 900A.

The circuits forming the SDFFRPQ circuit 80 of FIG. 8 are arranged in the SDFFRPQ cell 900A as follows. The scan inverter 810 is configured by a two-fin inverter over the gate grids G1 and G2, and the scan stage circuit 830 is provided over the gate grids G3 through G7. The master latch 840 is provided over the gate grids G8 through G12, and the master data path circuit 850 is provided over the gate grids G13 through G15. The slave latch 860 is provided over the gate grids G16 through G20, and the slave data path circuit 870 is provided over the gate grids G21 through G23. The clock inverter 820 is configured by a two-fin inverter over the gate grids G24 and G25, and the output circuit 880 is also configured by a two-fin inverter over the gate grids G26 and G27.

FIG. 9A also shows that the SDFFRPQ cell 900A includes power rails M1 and M2 respectively connected to a power source and a ground source, a plurality bottom source/drain regions RX1 connected to the power rails M1 or M2, a plurality bottom source/drain regions RX2 connecting bottom source/drains of VFETs forming the SDFFRPQ circuit 80, a plurality top source/drain contact structures CA1 connected to the power rails M1 or M2, and a plurality top source/drain contact structures CA2 connected to top source/drains of the VFETs. Further, the SDFFRPQ cell 900A includes a plurality gate contact structures CB receiving gate signals for the VFETs, and a plurality gate layer cuts CT disposed between and at the sides of the 27 gate grids.

FIG. 9B shows an SDFFRPQ cell 900B which is converted from the SDFFRPQ cell 900A by repositioning the clock inverter 820, the output circuit 880, and the slave data path circuit 870 right next to the master latch 840. Further, the master data path circuit 850 and the slave latch 860 are repositioned right next to the slave data path circuit 870. Thus, in the SDFFRPQ cell 900B, the scan inverter 810, the scan stage circuit 830, the master latch 840, the clock inverter 820, the output circuit 880, the slave data path circuit 870, the master data path circuit 850, and the slave latch 860 are positioned in this order over the gate grids G1 through G27.

Here, the master data path circuit 850 and the slave data path circuit 870 placed over the gate grids G13 through G15 and G21 through G23, respectively, in the SDFFRPQ cell 900A are now sequentially placed to be next to each other over the gate grids G17 through G22 in the SDFFRPQ cell 900B. Specifically, the master data path circuit 850 positioned on the left side of the slave data path circuit 870 with the slave latch 860 therebetween in the SDFFRPQ cell 900A is now placed on the right side of the slave data path circuit 870 and the left side of the slave latch 860, and its internal routing is changed so that the master data path circuit 850 can share, as its gate signal, a gate signal of the adjacent slave data path circuit 870, and the slave latch 860 can share a source/drain signal of the master data path circuit 850 as its gate signal, as described later in reference with FIG. 9C.

Further, the clock inverter 820 and the output circuit 880 placed over the gate grids G24 through G27 in the SDFFRPQ cell 900A are now placed over the gate grids G13 through G16 between the master latch 840 and the slave data path circuit 870 so that these two inverter circuits can, respectively, have a merged bottom source/drain region with the adjacent master latch 840 and share a source/drain signal of the slave data path circuit 870, as described below in reference with FIG. 9C.

FIG. 9C shows an SDFFRPQ cell 900C which is converted from the SDFFRPQ cell 900B by changing the two-fin inverter of each of the scan inverter 810 and the output circuit 880 shown in FIGS. 9A and 9B to a one-fin inverter. By this change, the scan inverter 810, which is now a one-fin inverter, can share, as its gate signal, a gate signal of a VFET of the scan stage circuit 830 placed on its right side, which is the scan enable signal SE input to the scan inverter 810 and the scan stage circuit 830 in common. Here, the gate signal, i.e., the scan enable signal SE, shared by the scan inverter 810 and the scan stage circuit 830 may be input to the VFET formed on the gate grid G2 of the scan stage circuit 830 in the SDFFRPQ cell 900C. Further, the output circuit 880, which is also now a one-fin inverter, can share a source/drain signal of the slave data path circuit 870 as its gate signal, as shown in FIG. 8. It is noted here that since the gates of the output circuit 880 can receive its gate signal from the adjacent slave data path circuit 870 as described above, the two-fin inverter of the output circuit 880 can be changed to a one-fin inverter, that is, 1-CPP inverter, without a separate gate structure.

With the above change of the two-fin inverter to the one-fin inverter in the scan inverter 810 and the output circuit 880 for sharing a gate signal and a source/drain signal with the adjacent scan stage circuit 830 and the slave data path circuit 870, respectively, the two gate layer cuts CT between the scan inverter 810 and the scan stage circuit 830 and between the output circuit 880 and the slave data path circuit 870 can be removed for gate rerouting, as shown in FIG. 9C.

By the above changes of the scan inverter 810 and the output circuit 880, two gate grids and two CPPs may be reduced in the SDFFRPQ cell 900C.

FIG. 9C further shows that, in order to prevent a narrow bottom source/drain region in the SDFFRPQ cell 900C for semiconductor patterning convenience, the bottom source/drain region RX1 of the one-fin inverter of the output circuit 880 formed at the gate grid G14 and connected to the power rails M1 and M2 is merged with the bottom source/drain region RX1 of the adjacent clock inverter 820 formed at the gate grids G12 and G13 and connected to the same power rails M1 and M2. Thus, the clock inverter 820 and the output circuit 880 now share a power signal and a ground signal in common through the merged bottom source/drain region.

Moreover, as the master data path circuit 850 and the slave data path circuit 870 are placed next to each other in reversed positions in the SDFFRPQ cell 900C, the NOR circuit of the master data path circuit 850 provided over three gate grids G20 through G22 (3-CPP NOR) in the SDFFRPQ cell 900B is changed to a NOR circuit over two gate grids G18 and G19 (2-CPP NOR) because this 2-CPP NOR circuit can share, as its gate signal, the reset signal R received at the adjacent 3-CPP NOR circuit of the slave data path circuit 870, and further, the slave latch 860 placed on the right side of the master data path circuit 850 can share, as its gate signal, a source/drain signal of the master data path circuit 850 as shown in FIG. 8, thereby reducing another one gate grid and one CPP in the SDFFRPQ cell 900C.

With the above change of the 3-CPP NOR circuit to the 2-CPP NOR in the master data path circuit 850 circuit for sharing a gate signal (reset signal R) of the slave data path circuit 870 and sharing a source/drain signal of the 2-CPP NOR as a gate signal of the slave latch 860, respectively, the two gate layer cuts CT between the slave data path circuit 870 and the master data path circuit 850 and between the master data path circuit 850 and the slave latch 860 can be removed for gate rerouting, as shown in FIG. 9C.

By the above changes of the master data path circuit 850 and the slave data path circuit 870, one gate grid and one CPP may be reduced in the SDFFRPQ cell 900C.

In all, the SDFFRPQ cell 900A having 27 gate grids and 27 CPPs may be converted to the SDFFRPQ cell 900C having 24 gate grids and 24 CPPS by reducing three gate grids and three CPPs, according to the present embodiment.

As described above, the present embodiment enables design of an SDFFRPQ cell formed of a plurality VFETs to have a smaller number of gate grids and CPPs, that is, a reduced cell width. Further, the SDFFRPQ cell designed according to the present embodiment enables easier patterning of a merged bottom source/drain region and an extended top source/drain contact structure of a VFET.

Similar conversions of a VFET cell are now applied to another flip-flop circuit.

Figure 10:
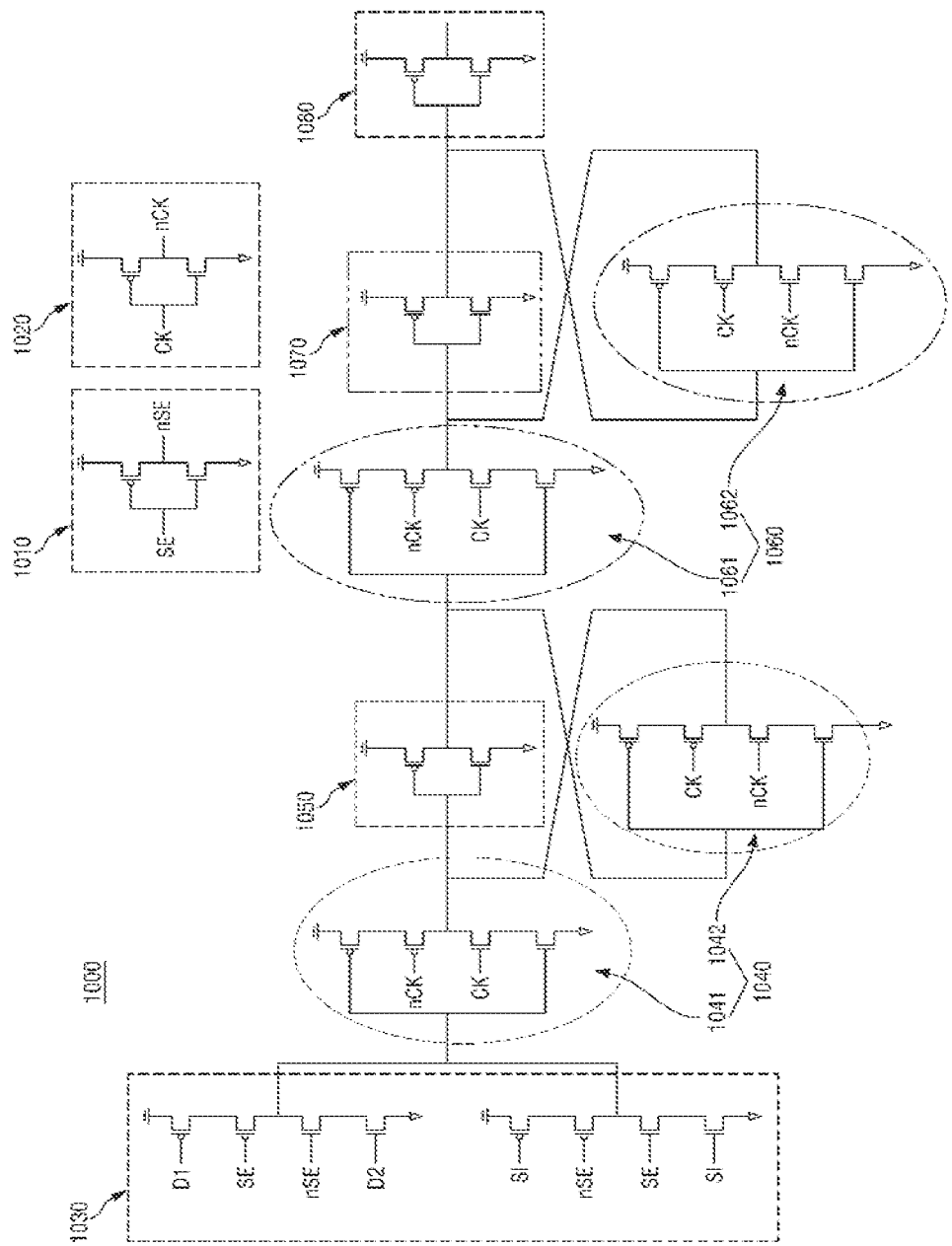
FIG. 10 illustrates a schematic of a scan-enabled flip-flop circuit (SDFFQ circuit) formed of a plurality of VFETs, according to an embodiment.

FIG. 10 illustrates a schematic of a scan-enabled flip-flop circuit (hereafter referred to as "SDFFQ circuit") formed of a plurality of VFETs, according to an embodiment.

Referring to FIG. 10, an SDFFQ circuit 1000 includes a scan inverter 1010, a clock inverter 1020, a scan stage circuit 1030, a master latch 1040, a master data path circuit 1050, a slave latch 1060, a slave data path circuit 1070, and an output circuit 1080.

The scan stage circuit 1030 includes a first set of two PMOSs and two NMOSs connected in series between a power source and a ground source to respectively receive a data signal D1, a scan enable SE, an inverted scan enable signal nSE and a data signal D2. A drain of a PMOS and a drain of an NMOS connected to each other in series in the first set are connected to an input node of the master latch 1040.

The scan stage circuit 1030 also includes a second set of two PMOSs and two NMOSs connected in series between the power source and the ground source to respectively receive a scan input signal SI, the inverted scan enable signal nSE, the scan enable signal SE and the scan input signal SI. A drain of a PMOS and a drain of an NMOS connected to each other in series in the second set are also connected to the input node of the master latch 1040.

The master latch 1040 includes a tri-state inverter 1041 receiving an output signal of the scan stage circuit 1030, and a tri-state inverter 1042 of which an output node is connected to an output node of the tri-state inverter 1041. Each of the tri-state inverter 1041 and the tri-state inverter 1042 is gated to a clock signal CK and an inverted clock signal nCK. An output node of the tri-state inverter 1042 is connected to an output node of the tri-state inverter 1041.

According to an embodiment, the master data path circuit 1050 delivering an output signal of the master latch 1040 to the slave latch 1060 is configured by an inverter which is gated to output nodes of the tri-state inverters 1041 and 1042 of the master latch 1040 to receive an output signal of the tri-state inverter 1041 or 1042 as its gate input signal. The master data path circuit 1050 delivers its output signal to the slave latch 1060, and also feedback to an input node of the tri-state inverter 1042 of the master latch 1040.

The slave latch 1060 includes a tri-state inverter 1061 receiving the output signal of the master data path circuit 1050, and a tri-state inverter 1062 of which an output node is connected to an output node of the tri-state inverter 1061. Each of the tri-state inverter 1061 and the tri-state inverter 1062 is gated to a clock signal CK and an inverted clock signal nCK.

According to an embodiment, the slave data path circuit 1070 delivering an output signal of the slave latch 1060 to the output circuit 1080 is configured by an inverter which is gated to output nodes of the tri-state inverters 1061 and 1062 of the master latch 1060 to receive an output signal of the tri-state inverter 1061 or 1062 as its gate input signal. The slave data path circuit 1070 delivers its output signal to the output circuit 1080, and also feedback to an input node of the tri-state inverter 1062 of the master latch 1060.

The output circuit 1080 is configured by an inverter.

According to the present embodiment, the SDFFQ circuit 1000 is designed not to include any of the above-listed VFET arrangements shown in FIGS. 7A through 7D that may cause increase of a cell width in a VFET cell so that at least one gate signal and at least one source/drain signal can be shared in a SDFFQ cell implementing the SDFFQ circuit 100.

Figure 11A:
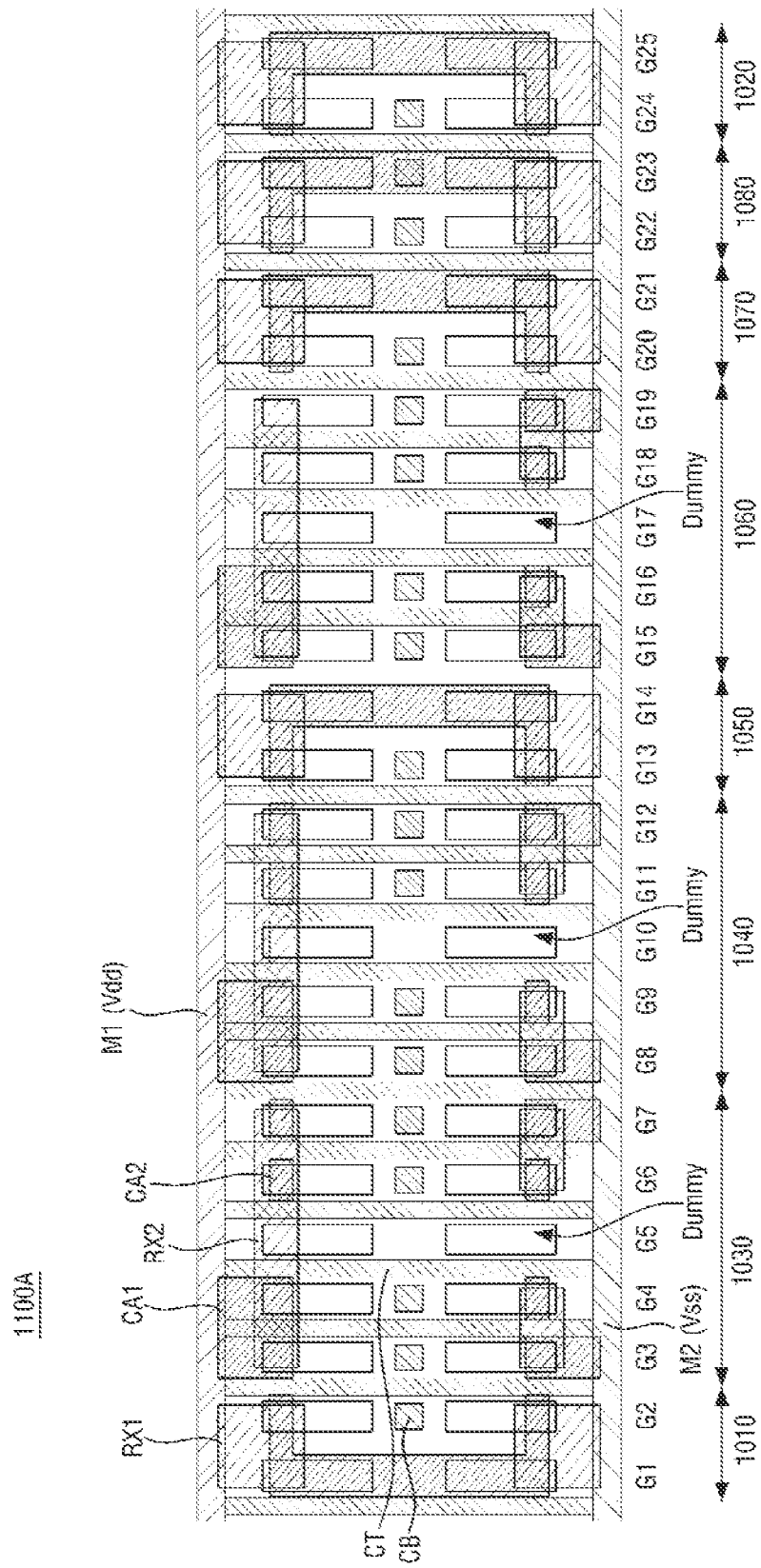
FIGS. 11A through 11C illustrate VFET cell layouts implementing an SDFFQ circuit in which at least one gate signal and/or at least one source/drain signal are shared between sub-circuits, according to embodiments.
Figure 11B:
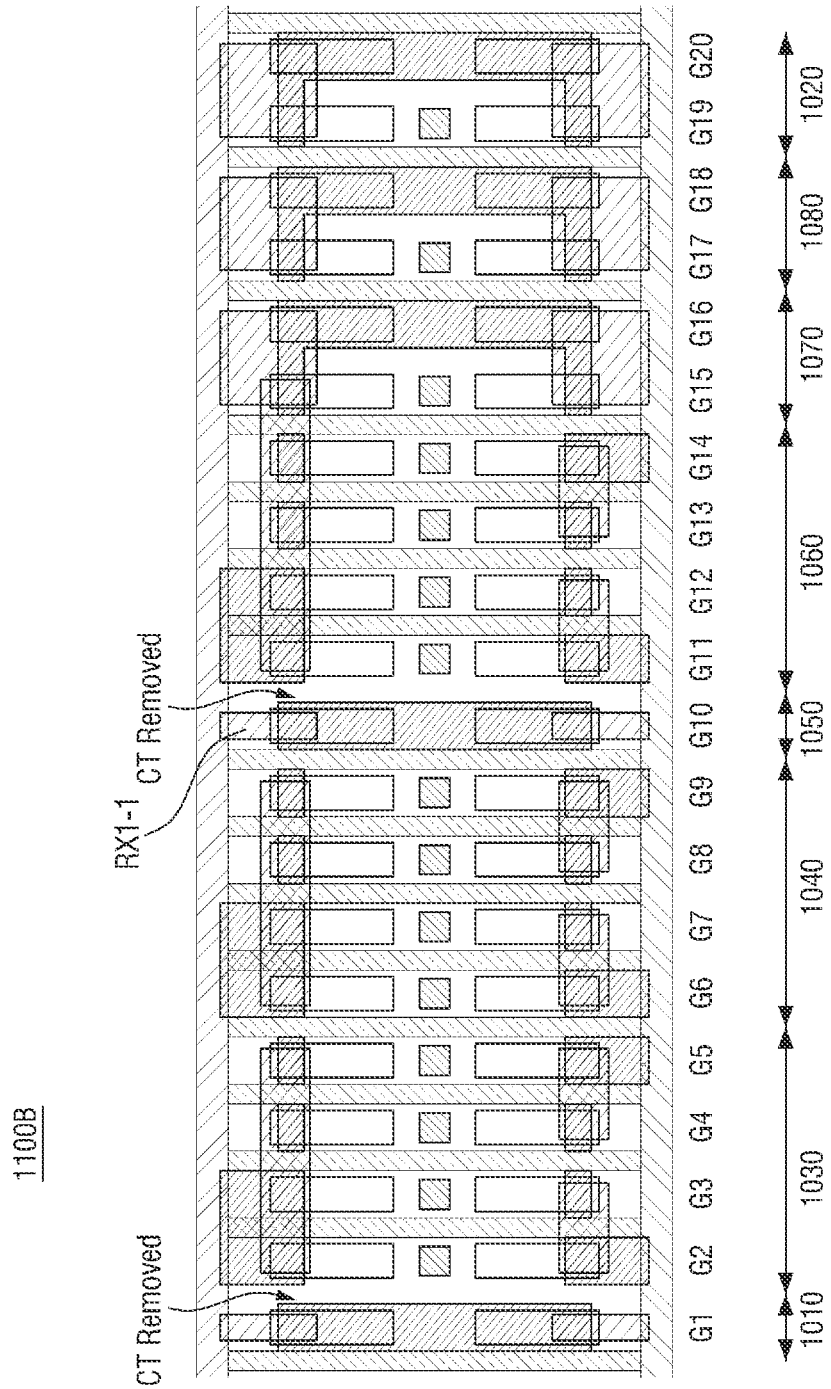
Figure 11C:
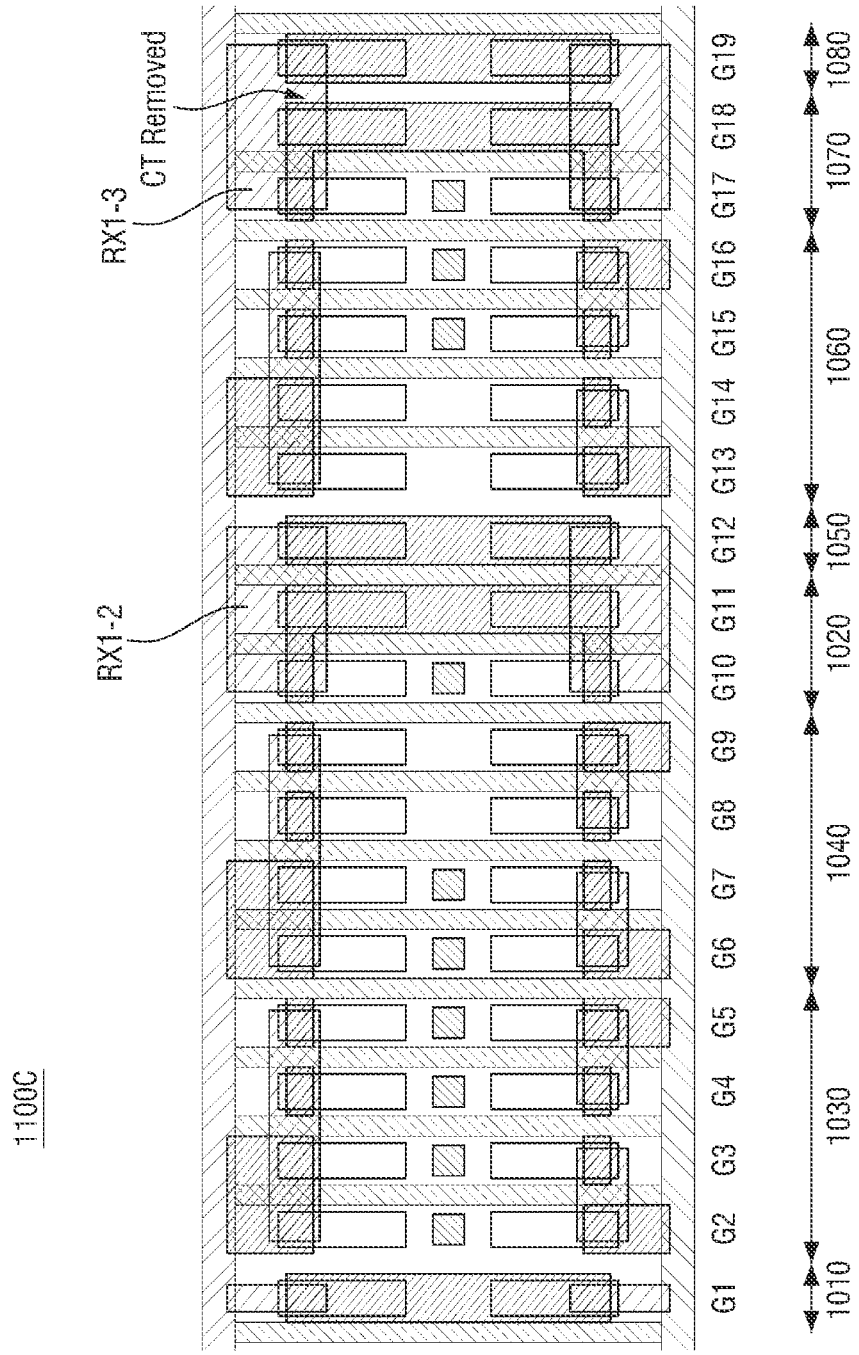

FIGS. 11A through 11C illustrate VFET cell layouts implementing an SDFFQ circuit in which at least one gate signal and/or at least one source/drain signal are shared between sub-circuits, according to embodiments. The VFET cell layouts of FIGS. 11A through 11C implement the SDFFQ circuit 1000 shown in FIG. 10.

Referring to FIG. 11A, an SDFFQ cell 1100A provides the SDFFQ circuit 1000 of FIG. 10 over 25 gate grids G1 through G25 including two dummy gate grids which are consecutively formed and evenly spaced therein. Thus, the SDFFRPQ cell 1100A is 25 CPP wide when including a length occupied by gate layer cuts formed at the left side and the right side of the SDFFQ cell 1100A.

The circuits forming the SDFFQ circuit 1000 of FIG. 10 are arranged in the SDFFQ cell 1100A as follows. The scan inverter 1010 is configured by a two-fin inverter over the gate grids G1 and G2, and the scan stage circuit 1030 is provided over the gate grids G3 through G7, where the gate grid G5 is dummy. The master latch 1040 is provided over the gate grids G8 through G12 where the gate grid G10 is dummy, and the master data path circuit 1050 is configured by a two-fin inverter over the gate grids G13 and G14. The slave latch 1060 is provided over the gate grids G15 through G19, where the gate grid G17 is dummy, and the slave data path circuit 1070 is configured by a two-fin inverter over the gate grids G20 and G21. The output circuit 1080 is configured by a two-fin inverter over the gate grids G22 and G23, and the clock inverter 1020 is also configured by a two-fin inverter over the gate grids G24 and G25.

FIG. 11A also shows that the SDFFQ cell 1100A includes power rails M1 and M2 respectively connected to a power source and a ground source, a plurality bottom source/drain regions RX1 connected to the power rails M1 or M2, a plurality bottom source/drain regions RX2 connecting bottom source/drains of VFETs forming the SDFFQ circuit 1000, a plurality top source/drain contact structures CA1 the power rails M1 or M2, and a plurality top source/drain contact structures CA2 connecting top source/drains of the VFETs. Further, the SDFFQ cell 1100A includes a plurality gate structures CB receiving gate signals for the VFETs, and a plurality gate layer cuts CT disposed between and at the sides of the 25 gate grids.

FIG. 11B shows an SDFFQ cell 1100B which is converted from the SDFFQ cell 1100A by removing the three dummy gate grids G5, G10 and G17 in the SDFFQ cell 1100A, and changing each two-fin inverter of the scan inverter 1010 and the master data path circuit 1050 to a one-fin inverter, thereby reducing five gate grids and five CPPs.

Further in the SDFFQ cell 1100B, as each two-fin inverter of the scan inverter 1010 and the master data path circuit 1050 in the SDFFQ cell 1100A is changed to a one-fin inverter considering gate signal sharing with the adjacent scan stage circuit 1030 and the slave latch 1060, respectively, the two gate layer cuts CT between the scan inverter 1010 and the scan stage circuit 1030 and between the master data path circuit 1050 and the slave latch 1060 can be removed for gate rerouting.

FIG. 11C shows an SDFFQ cell 1100C which is converted from the SDFFQ cell 1100B by repositioning the clock inverter 1020 to the left side of the master data path circuit 1050, and changing the two-fin inverter of the output circuit 1080 to a one-fin inverter to reduce another gate grid and one CPP. Thus, in the SDFFQ cell 1100C, the scan inverter 1010, the scan stage circuit 1030, the master latch 1040, the clock inverter 1020, the master data path circuit 1050, the slave latch 1060, the slave data path circuit 1070, and the output circuit 1080 are positioned in this order over the gate grids G1 through G19.

By the above changes in the SDFFQ cell 1100C, the scan inverter 1010, which is now a one-fin inverter, can share, as its gate signal, a gate signal of a VFET of the scan stage circuit 1030 placed on its right side, which is the scan enable signal SE input to the scan inverter 1010 and the scan stage circuit 1030 in common. Here, the gate signal, i.e., the scan enable signal SE, shared by the scan inverter 1010 and the scan stage circuit 1030 may be input to the VFET formed on the gate grid G2 of the scan stage circuit 1030 in the SDFFQ cell 1100C. Further, a source/drain signal of the one-fin inverter of the master data path circuit 1050 is shared as a gate signal of a VFET of the slave latch 1060 placed on its right side as shown in FIG. 10. This one-fin inverter of the master data path circuit 1050 also has a merged bottom source/drain region RX1-2 formed by merging its narrow bottom source/drain region RX1-1 (FIG. 11B) with the bottom source/drain region RX1 of the clock inverter 1020, which is a two-fin inverter, formed at the gate grids G10 and G11.

In addition, since the output circuit 1080 is gated to an output node of the slave data path circuit 1070, which is a source/drain of a VFET of the slave data path circuit 1070, the two-fin inverter of the output circuit 1080 is changed to a one-fin inverter because it can receive its gate signal from the source/drain of the VFET of the adjacent slave data path circuit 1070 without a separate gate structure. For this source/drain signal sharing, the gate layer cut formed between the slave data path circuit 1070 and the output circuit 1080 is removed. By this change of the output circuit 1080 to the one-fin inverter, an additional gate grid and CPP may be reduced in the SDFFQ cell 1100C.

The one-fin inverter of the output circuit 1080 also has a merged bottom source/drain region RX1-3 by merging its narrow bottom source/drain region formed at the gate grid G19 with the bottom source/drain region RX1 of the slave data path circuit 1070 formed at the gate grids G17 and G18.

In all, the SDFFQ cell 1100A having 25 gate grids and 25 CPPs may be converted to the SDFFQ cell 1100C having 19 gate grids and 19 CPPS by reducing six gate grids and six CPPs, according to the present embodiment.

As described above, the present embodiment enables design of an SDFFQ cell formed of a plurality VFETs to have a smaller number of gate grids and CPPs, that is, a reduced cell width. Further, the SDFFQ cell designed according to the present embodiment enables easier patterning of a merged bottom source/drain region and an extended top source/drain contact structure of a VFET.

Herein, when circuits such as the scan inverter 1010 and the scan stage circuit 1030 share a same gate signal as described above, these two circuits are referred to as being in a same net. Further, when a circuit such as the output circuit 1080 shares a source/drain signal of another circuit such as slave data path circuit 1070, these two circuits are also referred to as being in a same net.

From the above embodiments, a VFET cell of a VFET circuit may be designed by a plurality of steps described below to reduce a cell area.

Figure 12:
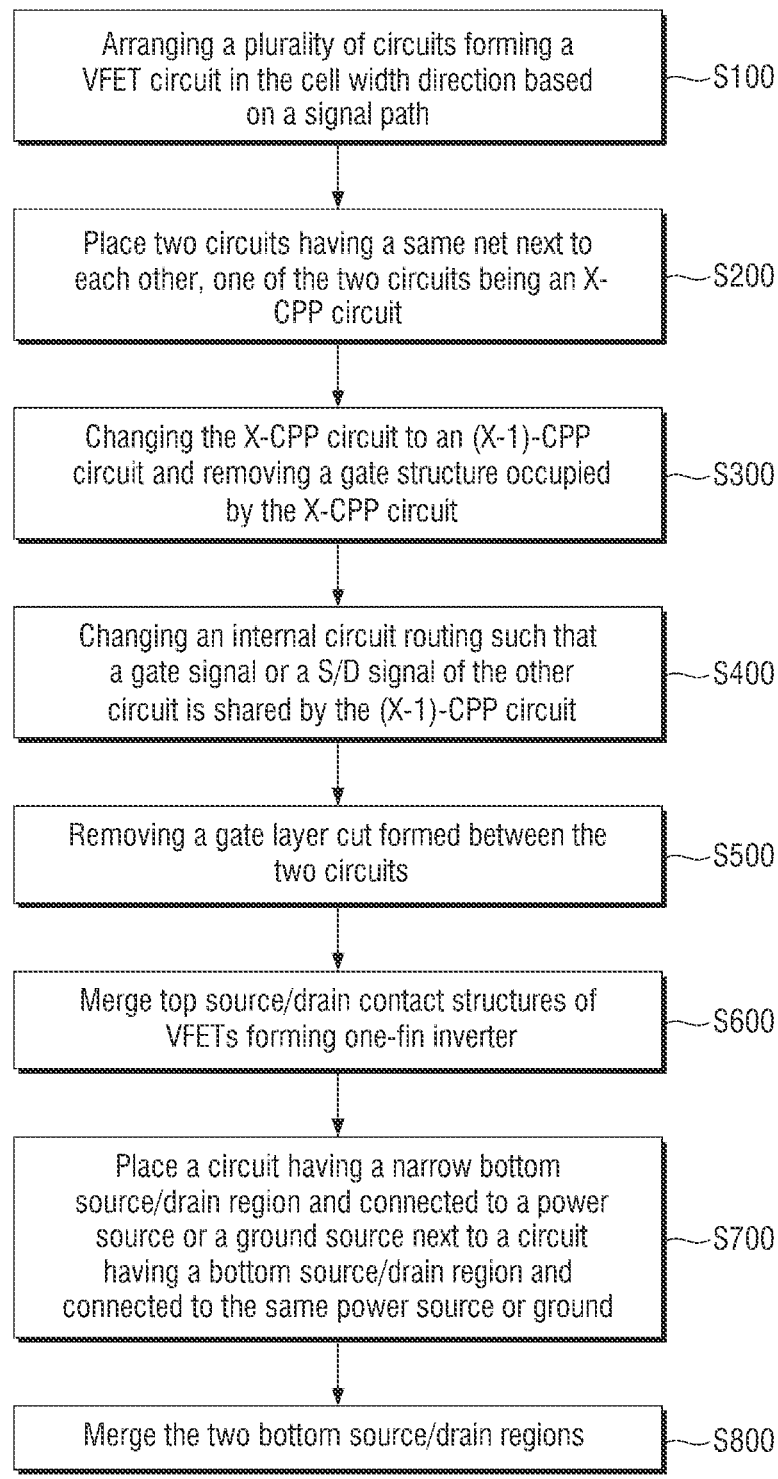
FIG. 12 illustrates a method of designing a VFET cell of a VFET circuit, according to an embodiment.

FIG. 12 illustrates a method of designing a VFET cell of a VFET circuit, according to an embodiment. The VFET cell designed according to the present embodiment implements a VFET circuit including a plurality of circuits, each of which is formed of one or more VFETs, over a plurality of gate grids in the VFET cell.

First, the VFETs forming the VFET circuit are arranged in the cell width direction based on a signal path such that an input circuit configured to receive an input signal of the VFET circuit is placed at a left side of an output circuit configured to transmit an output signal of the VFET circuit (S100).

Second, two circuits in the VFET circuit having a same net, in which a gate signal or a source/drain signal of one circuit is shared by a gate or a source/drain of the other circuit, are placed next to each other, where one of the two circuits is an X-CPP circuit, X being an integer greater than 1, such as a two-fin inverter or 2-CPP inverter (S200). Another example of the X-CPP circuit may be the 3-CPP NOR circuit of the master data path circuit 850 shown in FIG. 9B.

Third, the X-CPP circuit is changed to an (X−1)-CPP circuit such as a one-fin inverter or 1-CPP inverter, and one gate structure, corresponding to one gate grid, occupied by the X-CPP circuit is removed (S300).

Fourth, an internal circuit routing in at least one of the (X−1)-CPP circuit and the other circuit is changed such that a gate signal or a source/drain signal of the other circuit is shared by the (X−1)-CPP circuit as its gate signal (S400). An example of the (X−1)-CPP circuit may be the 2-CPP NOR circuit of the master data path circuit 850 shown in FIG. 9C.

Fifth, a gate layer cut formed between the two circuits is removed (S500).

Sixth, top source/drain contact structures of VFETs forming a one-fin inverter provided over only one gate grid are merged to form an extended top source/drain contact structure (S600).

Seventh, a circuit having a narrow bottom source/drain region, formed over only one gate grid and connected to a power source or a ground source, is placed next to another circuit having a bottom source/drain region formed at one or more gate grids and connected to the same power source or ground source so that the two bottom source/drain regions can be merged (S700).

Eighth, the bottom source/drain regions of the two circuits placed next to each other in the seventh step are merged (S800). Here, the circuit having the narrow bottom source/drain region may be the (X−1)-CPP circuit.

Although the above steps are described in order, the inventive concept is not limited thereto at least because the order of these steps may be changed, or one or more of these steps may be omitted according to a design choice.

The steps or operations of the method described above can be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), random-access memory (RAM), compact disc (CD)-ROM, digital versatile disc (DVD), magnetic tape, floppy disk, and optical data storage device, not being limited thereto. The transmission medium can include carrier waves transmitted through the Internet or various types of communication channel. The computer readable recording medium can also be distributed over network coupled computer systems so that the computer readable code is stored and executed in a distributed fashion.

The VFET cells designed according to the above embodiments may be used in various components of a computing device as described below.

Figure 13:
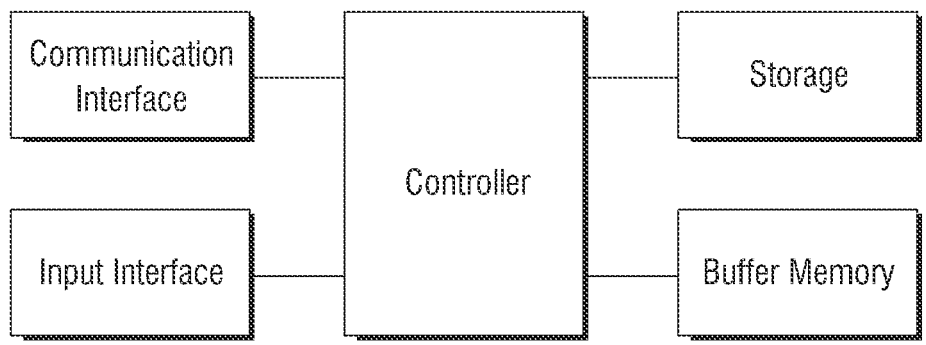
FIG. 13 illustrates a block diagram of a computing device incorporating VFET cell architectures designed according to embodiments.

Referring to FIG. 13, a computing device 1300 may include at least one controller such as microprocessor, a communication interface, an input interface, a storage, and a buffer memory, where the VFET cell architecture described above may apply.

The controller may control operations of the computing device 1300. The communication interface is implemented to perform wireless or wire communications with an external device. The input interface is implemented to output data processed by the controller in the form of audio and/or video, and receive input data. The storage is implemented to store various data including user data. The storage may be an embedded multimedia card (eMMC), a solid-state drive (SSD), a universal flash storage (UFS) device, etc. The storage may perform caching of the data described above.

The buffer may temporarily store data used for processing operations of the computing device 1300. For example, the buffer memory may be volatile memory such as double data rate (DDR) synchronous dynamic random-access memory (SDRAM), low power double data rate (LPDDR) SDRAM, graphics double data rate (GDDR) SDRAM, Rambus dynamic random access memory (RDRAM), etc.

At least one component in the computing device may include at least one of the cell architectures provided according to the above embodiments. The above embodiments may be applied to any electronic devices and systems. For example, these embodiments may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of embodiments and is not to be construed as limiting thereof. Although a few embodiments have been described, those skilled in the art will readily appreciate that many modifications are possible in the above embodiments without materially departing from the inventive concept. Thus, the inventive concept may apply to not only the above-described embodiments of multiplexer and flip-flop circuits but also many other VFET circuits.

What is claimed is:

1. A vertical field effect transistor (VFET) cell implementing a scan flip-flop with a reset input comprising a plurality of circuits over 1st through 24th gate grids, which are consecutively formed and evenly spaced in the VFET cell,
wherein the 1st gate grid provides a one-fin scan inverter,
wherein the 2nd through 6th gate grids provide a scan stage circuit configured to receive a scan input signal, a data signal, a scan enable signal, and an inverted scan enable signal,
wherein the 7th through 11th gate grids provide a master latch,
wherein the 12th and 13th gate grids provide a two-fin clock inverter,
wherein the 14th gate grid provides an output circuit comprising a one-fin inverter,
wherein the 15th through 17th gate grids provide a slave data path circuit configured to receive a reset signal for the master latch,
wherein the 18th and 19th gate grids provide a master data path circuit configured to receive the reset signal for a slave latch, and
wherein the 20th through 24th gate grids provide the slave latch.

2. The VFET cell of claim 1, wherein each of the master latch and the slave latch comprises two tri-state inverters, and
wherein each of the master data path circuit and the slave data path circuit comprises a NOR circuit.

3. The VFET cell of claim 2, wherein a gate of the one-fin scan inverter is configured to share a gate signal with a gate of the scan stage circuit.

4. The VFET cell of claim 3, wherein a bottom source/drain region of the one-fin inverter of the output circuit is merged with a bottom source/drain region of the two-fin clock inverter, and wherein a gate of the one-fin inverter of the output circuit shares a source/drain signal of the NOR circuit of the slave data path circuit.

5. The VFET cell of claim 4, wherein a gate of the slave latch shares a source/drain signal of the master data path circuit.

6. A vertical field effect transistor (VFET) cell implementing a scan flip-flop comprising a plurality of circuits over 1st through 19th gate grids, which are consecutively formed and evenly spaced in the VFET cell,
wherein the 1st gate grid provides a one-fin scan inverter,
wherein the 2nd through 5th gate grids provide a scan stage circuit configured to receive to receive a scan input signal, a data signal, a scan enable signal, and an inverted scan enable signal,
wherein the 6th through 9th gate grids provide a master latch,
wherein the 10th and 11th gate grids provide a two-fin clock inverter,
wherein the 12th gate grid provides a master data path circuit comprising a one-fin inverter,
wherein the 13th through 16th gate grids provide a slave latch,
wherein the 17th and 18th gate grids provide a slave data path circuit comprising a two-fin inverter,
wherein the 19th gate grid provides an output circuit comprising a one-fin inverter, and
wherein each of the master latch and the slave latch comprises two tri-state inverters.

7. The VFET cell of claim 6, wherein a gate of the one-fin scan inverter is configured to share a gate signal with a gate of the scan stage circuit.

8. The VFET cell of claim 7, wherein a bottom source/drain region of the one-fin inverter of the master data path circuit is merged with a bottom source/drain region of the two-fin clock inverter, and
wherein a gate of the one-fin inverter of the master data path circuit shares a gate signal with a gate of the slave latch.

9. The VFET cell of claim 8, wherein a gate of the one-fin inverter of the output circuit shares a source/drain signal of the slave data path circuit.

* * * * *